(12) United States Patent
Chen et al.

US011342225B2

(10) Patent No.: US 11,342,225 B2
(45) Date of Patent: May 24, 2022

(54) BARRIER-FREE APPROACH FOR FORMING CONTACT PLUGS

(71) Applicant: Taiwan Semiconductor Manufacturing Company, Ltd., Hsinchu (TW)

(72) Inventors: Ching-Yi Chen, Hsinchu (TW); Sheng-Hsuan Lin, Zhubei (TW); Wei-Yip Loh, Hsinchu (TW); Hung-Hsu Chen, Tainan (TW); Chih-Wei Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 16/527,389

(22) Filed: Jul. 31, 2019

(65) Prior Publication Data

US 2021/0035861 A1 Feb. 4, 2021

(51) Int. Cl.
| | |
|---|---|
| *H01L 21/768* | (2006.01) |
| *H01L 29/66* | (2006.01) |
| *H01L 29/78* | (2006.01) |
| *H01L 27/092* | (2006.01) |
| *H01L 21/02* | (2006.01) |
| *H01L 21/8238* | (2006.01) |

(52) U.S. Cl.
CPC .. *H01L 21/76897* (2013.01); *H01L 21/02123* (2013.01); *H01L 21/02269* (2013.01); *H01L 21/02274* (2013.01); *H01L 21/76802* (2013.01); *H01L 21/76877* (2013.01); *H01L 21/823821* (2013.01); *H01L 21/823871* (2013.01); *H01L 27/0924* (2013.01); *H01L 29/66795* (2013.01); *H01L 29/785* (2013.01)

(58) Field of Classification Search
CPC ......... H01L 21/76897; H01L 21/02123; H01L 21/02269; H01L 21/02274; H01L 21/76802; H01L 21/76877; H01L 21/823821; H01L 21/823871
See application file for complete search history.

(56) References Cited

U.S. PATENT DOCUMENTS

| 5,918,118 A | 6/1999 | Kim et al. |
|---|---|---|
| 5,998,873 A | 12/1999 | Blair et al. |
| 6,861,350 B1 * | 3/2005 | Ngo ................. H01L 21/28088 |
| | | 257/E21.204 |

(Continued)

FOREIGN PATENT DOCUMENTS

| DE | 19960503 A1 | 6/2000 |
|---|---|---|
| KR | 20010009082 A | 2/2001 |

(Continued)

*Primary Examiner* — Lex H Malsawma
(74) *Attorney, Agent, or Firm* — Slater Matsil, LLP

(57) ABSTRACT

A method includes etching a dielectric layer of a substrate to form an opening in the dielectric layer, forming a metal layer extending into the opening, performing an anneal process, so that a bottom portion of the metal layer reacts with a semiconductor region underlying the metal layer to form a source/drain region, performing a plasma treatment process on the substrate using a process gas including hydrogen gas and a nitrogen-containing gas to form a silicon-and-nitrogen-containing layer, and depositing a metallic material on the silicon-and-nitrogen-containing layer.

20 Claims, 27 Drawing Sheets

(56) References Cited

U.S. PATENT DOCUMENTS

| | | |
|---|---|---|
| 7,566,655 B2 | 7/2009 | Balseanu et al. |
| 8,728,955 B2 | 5/2014 | LaVoie et al. |
| 9,105,490 B2 | 8/2015 | Wang et al. |
| 9,153,486 B2 | 10/2015 | Arghavani et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,558,955 B2 * | 1/2017 | Hsiao ................. H01L 21/3065 |
| 9,576,814 B2 | 2/2017 | Wu et al. |
| 9,831,183 B2 | 11/2017 | Lin et al. |
| 9,859,386 B2 | 1/2018 | Ho et al. |
| 10,008,569 B2 | 6/2018 | Hsu et al. |
| 10,164,033 B2 | 12/2018 | Yeo et al. |
| 10,325,911 B2 | 6/2019 | Lu et al. |
| 10,516,030 B2 | 12/2019 | Pan et al. |
| 10,686,074 B2 | 6/2020 | Tsai et al. |
| 10,825,727 B2 | 11/2020 | Tsai et al. |
| 10,840,243 B2 | 11/2020 | Lu et al. |
| 10,868,181 B2 | 12/2020 | Li et al. |
| 2001/0034136 A1 * | 10/2001 | Kim ................. H01L 21/31116 438/712 |
| 2002/0168468 A1 * | 11/2002 | Chou ................. H01J 37/32174 427/255.27 |
| 2004/0214416 A1 * | 10/2004 | Woo ................. H01L 29/4966 438/585 |
| 2010/0171169 A1 | 7/2010 | Mitani et al. |
| 2018/0047810 A1 * | 2/2018 | Hsu ................. H01L 29/7848 |
| 2020/0279929 A1 | 9/2020 | Li et al. |

FOREIGN PATENT DOCUMENTS

| | | |
|---|---|---|
| KR | 20130093569 A | 8/2013 |
| KR | 20180121314 A | 11/2018 |
| TW | 200703518 A | 1/2007 |
| TW | 201505075 A | 2/2015 |
| TW | 201606937 A | 2/2016 |
| TW | 201735309 A | 10/2017 |
| TW | 201806006 A | 2/2018 |
| TW | 201839910 A | 11/2018 |
| TW | 201841304 A | 11/2018 |
| TW | 201916178 A | 4/2019 |
| TW | 201916254 A | 4/2019 |
| TW | 201926472 A | 7/2019 |

* cited by examiner

BARRIER-FREE APPROACH FOR FORMING CONTACT PLUGS

BACKGROUND

In the manufacturing of integrated circuits, contact plugs are used for connecting to the source and drain regions and the gates of transistors. The source/drain contact plugs were typically connected to source/drain silicide regions, which are formed by forming contact openings to expose source/drain regions, depositing a metal layer, depositing a barrier layer over the metal layer, performing an anneal to react the metal layer with the source/drain regions, filling a metal such as tungsten or cobalt into the remaining contact opening, and performing a Chemical Mechanical Polish (CMP) process to remove excess metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
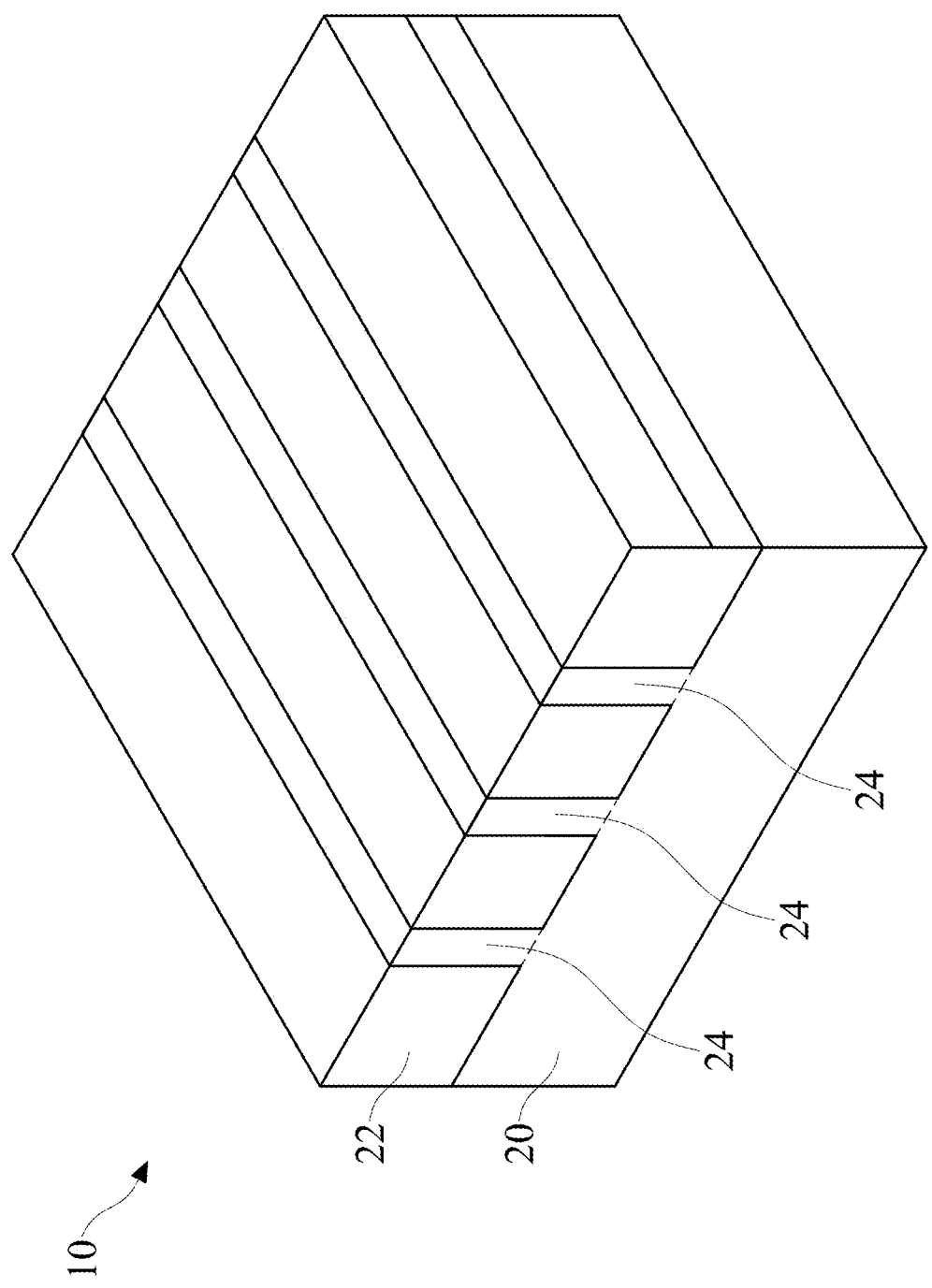
FIGS. 1-8, 9A, 9B, 9C, 10-18, and FIG. 24 are perspective views and cross-sectional views of intermediate stages in the formation of a transistor and the respective contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various embodiments. The intermediate stages in the formation of the FinFET are illustrated in accordance with some embodiments. Some variations of some embodiments are discussed. Throughout the various views and illustrative embodiments, like reference numbers are used to designate like elements. In accordance with some embodiments of the present disclosure, a FinFET and the corresponding contact plugs are formed. The formation of the contact plugs includes etching a dielectric layer(s) to form an opening, and performing a thermal soaking process using a silicon-containing process gas to add silicon on the exposed surfaces of the dielectric layer (s). The soaking process may be skipped if the exposed surfaces of the dielectric layer(s) already contain enough silicon. A plasma treatment is then performed on the surface using hydrogen ($H_2$) and nitrogen ($N_2$) as process gases, so that nitrogen atoms are connected to the silicon atoms. A deposition process is then performed to deposit metal into the opening, so that ultra-thin covalent Si—N-metal bonds are formed. No barrier layer (such as TiN barrier layer) is formed in the resulting contact plug. Accordingly, the widths of the resulting contact plugs are increased. By forming the ultra-thin Si—N-metal bonds and hence eliminating the barrier layer, the resistivity of the contact plugs is reduced.

Embodiments will be described with respect to a specific context, namely the formation of contact plugs. The concept of the discussed embodiments may also be applied to the structure and the processing of other structures including, and not limited to, the formation of metal lines, metal vias, etc. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIGS. 1-8, 9A, 9B, 10-18, and FIG. 24 illustrate the perspective views and cross-sectional views of intermediate stages in the formation of a FinFET in accordance with some embodiments of the present disclosure. The corresponding processes are also reflected schematically in the process flow shown in FIG. 25.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 25. The portions of substrate 20 between neighboring STI regions 22 are referred to as semiconductor strips 24. The top surfaces of semiconductor strips 24 and the top surfaces of STI regions 22 may be substantially level with each other in accordance with some embodiments. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
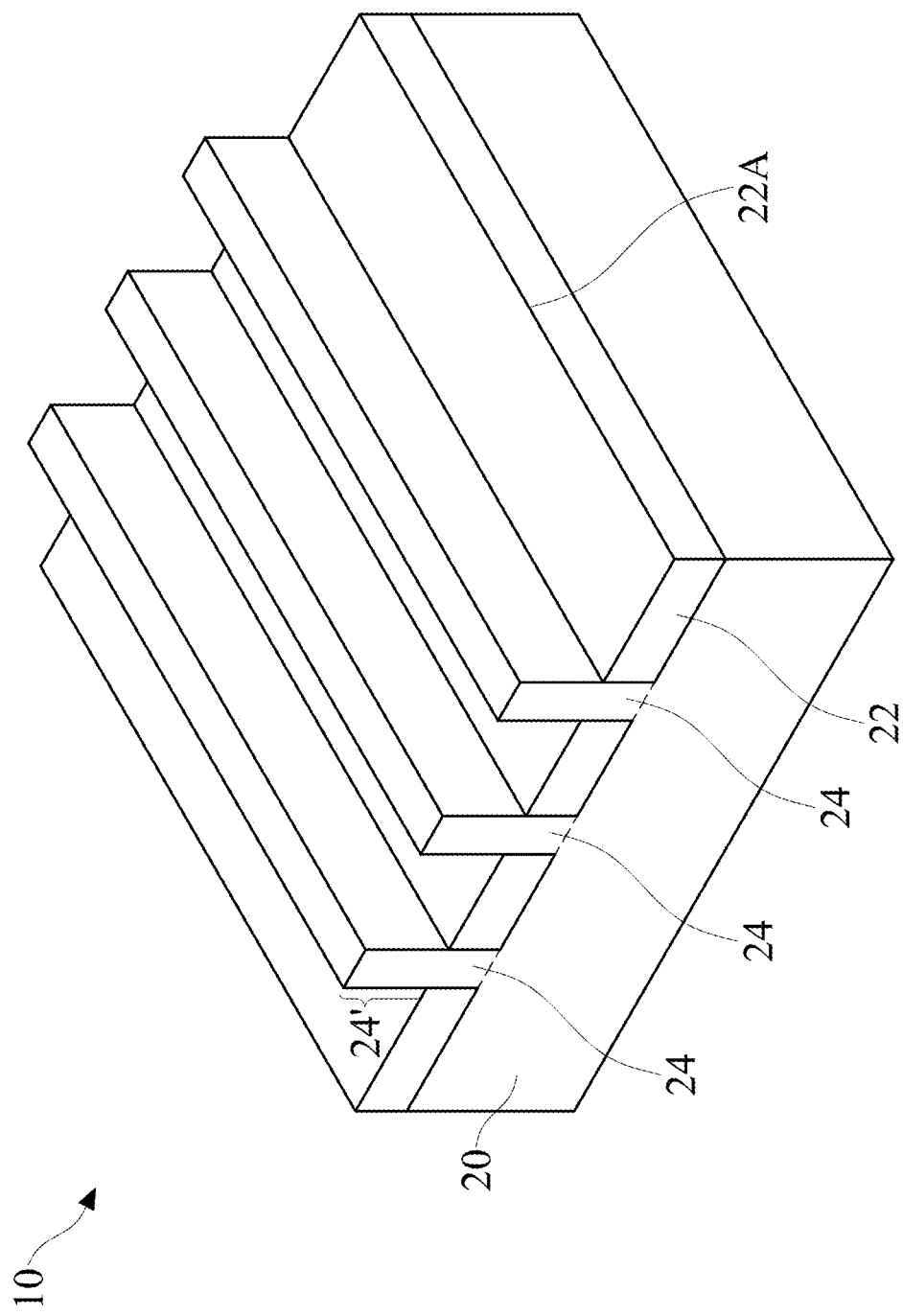

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 25. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
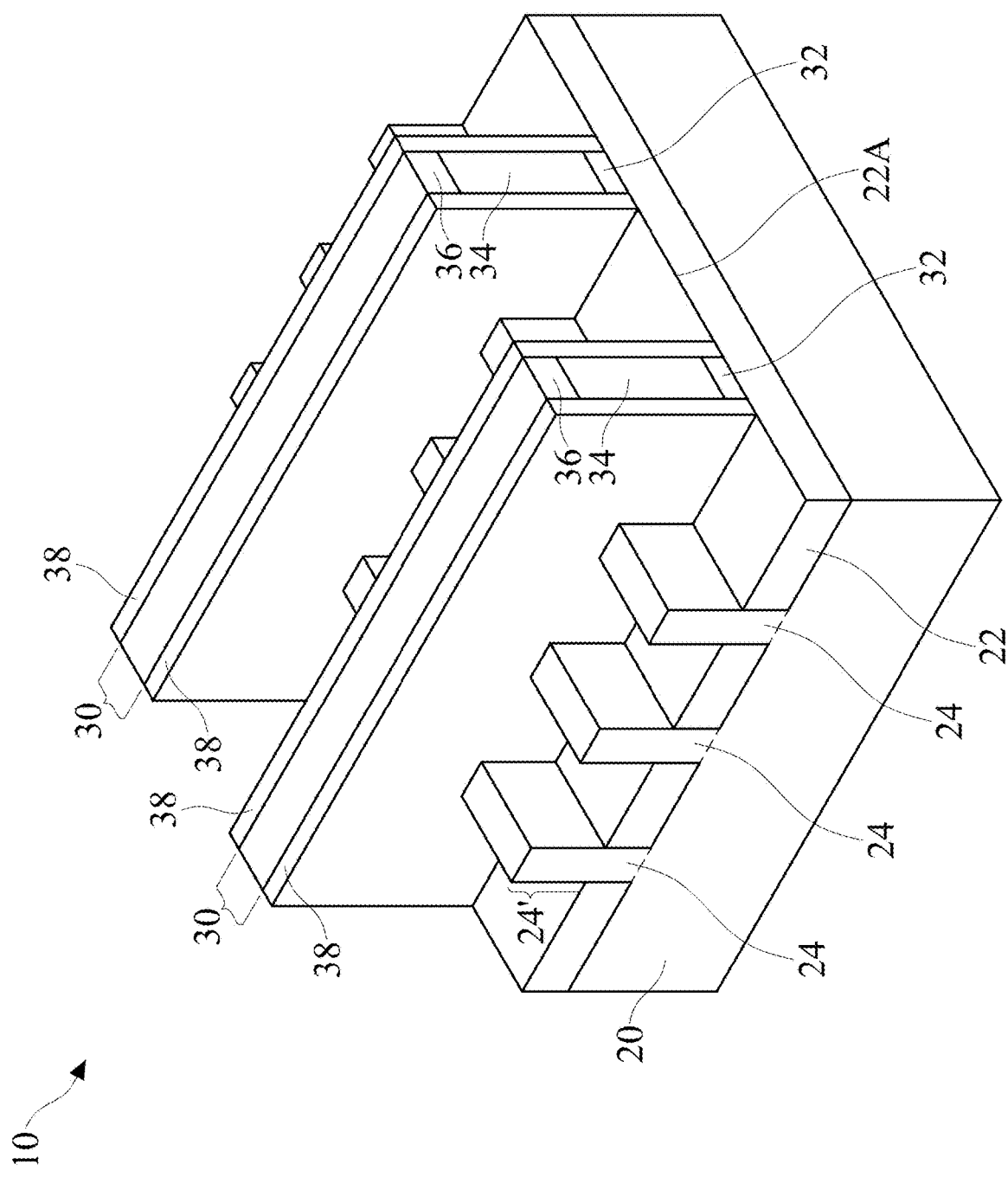

Referring to FIG. 3, dummy gate stack 30 is formed to extend on the top surfaces and the sidewalls of (protruding) fins 24'. The respective process is illustrated as process 206 in the process flow 200 shown in FIG. 25. Dummy gate stacks 30 may include dummy gate dielectrics 32 and dummy gate electrodes 34 over the respective dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon oxynitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
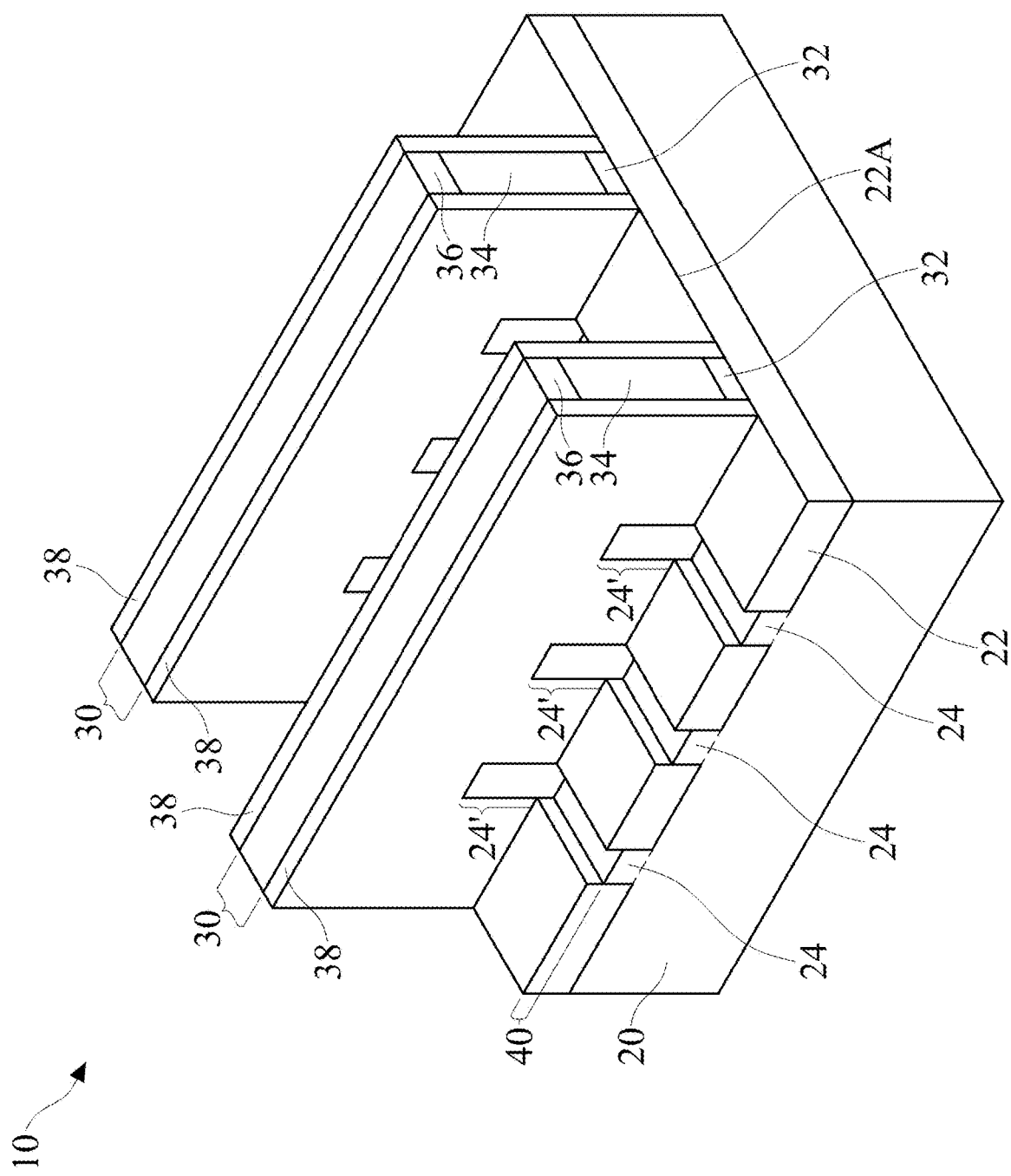

An etching step is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 25. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
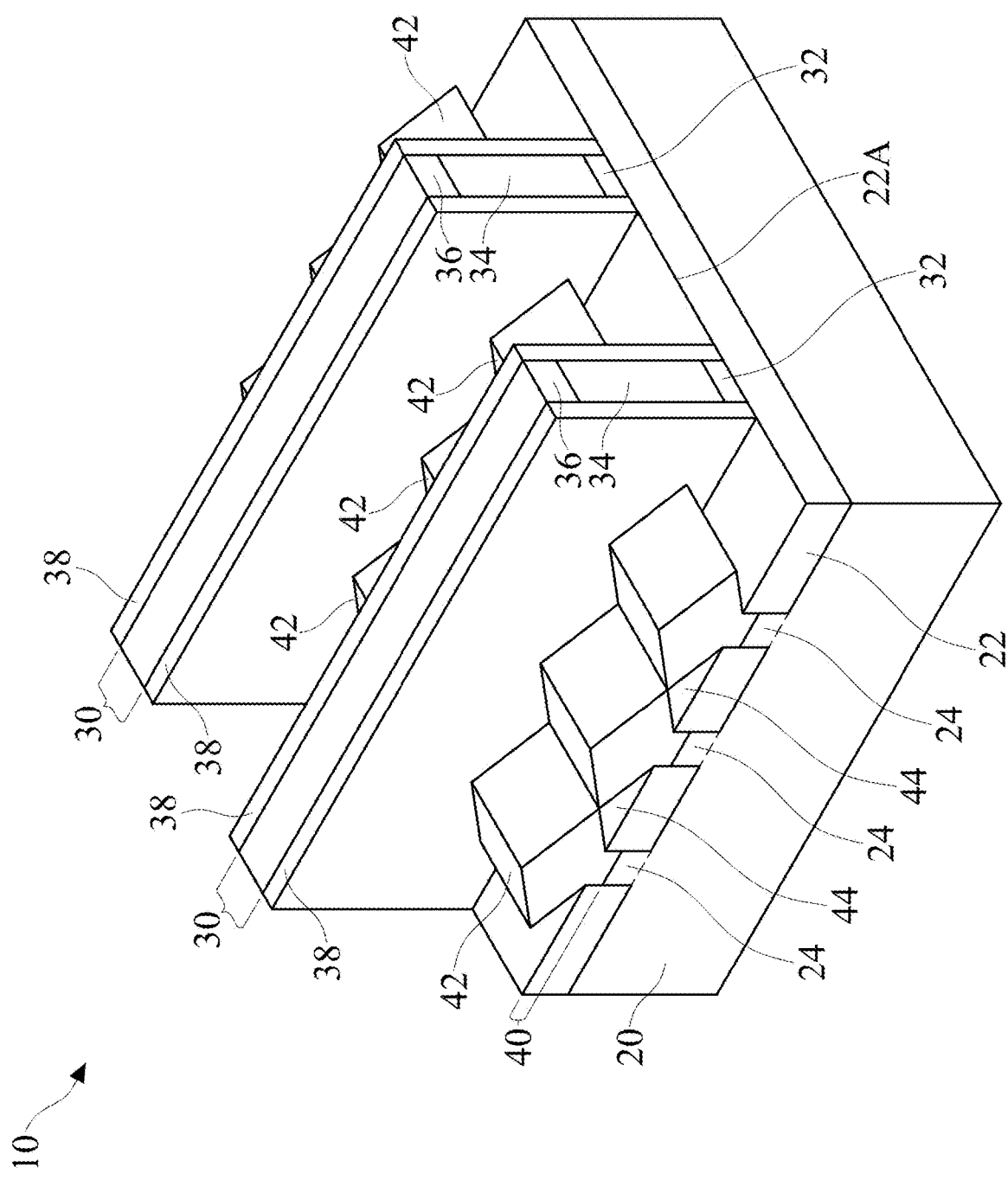
Figure 6:
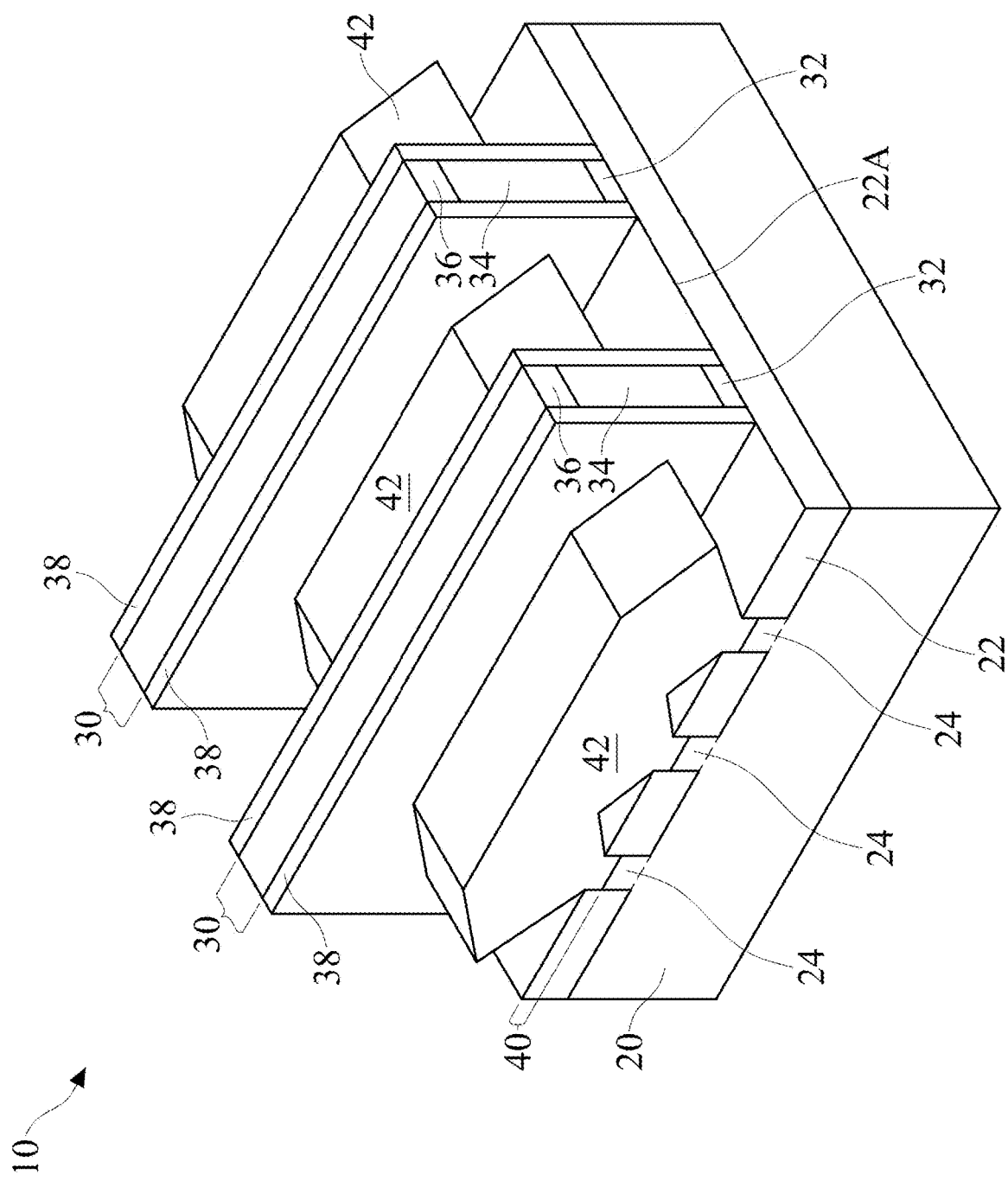

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 25. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorus (SiP), silicon carbon phosphorus (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

In accordance with alternative embodiments, instead of etching protruding fins 24', and then epitaxially growing source/drain regions, cladding source/drain regions are formed. In accordance with these embodiments, the protruding fins 24' as shown in FIG. 3 are not recessed, and epitaxy regions are grown on protruding fins 24' to form source/drain regions. The material of epitaxy regions may be similar to the material of the epitaxy semiconductor material 42 as shown in FIG. 5, depending on whether the resulting FinFET is a p-type or an n-type FinFET. Accordingly, the resultant source/drain regions 42 include protruding fins 24' and the epitaxy regions grown on the sidewalls and top surfaces of protruding fins 24'. An implantation may (or may not) be performed to implant an n-type impurity or a p-type impurity. The neighboring cladding source/drain regions may also merge with each other, or stay separated from each other.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy.

Figure 7:
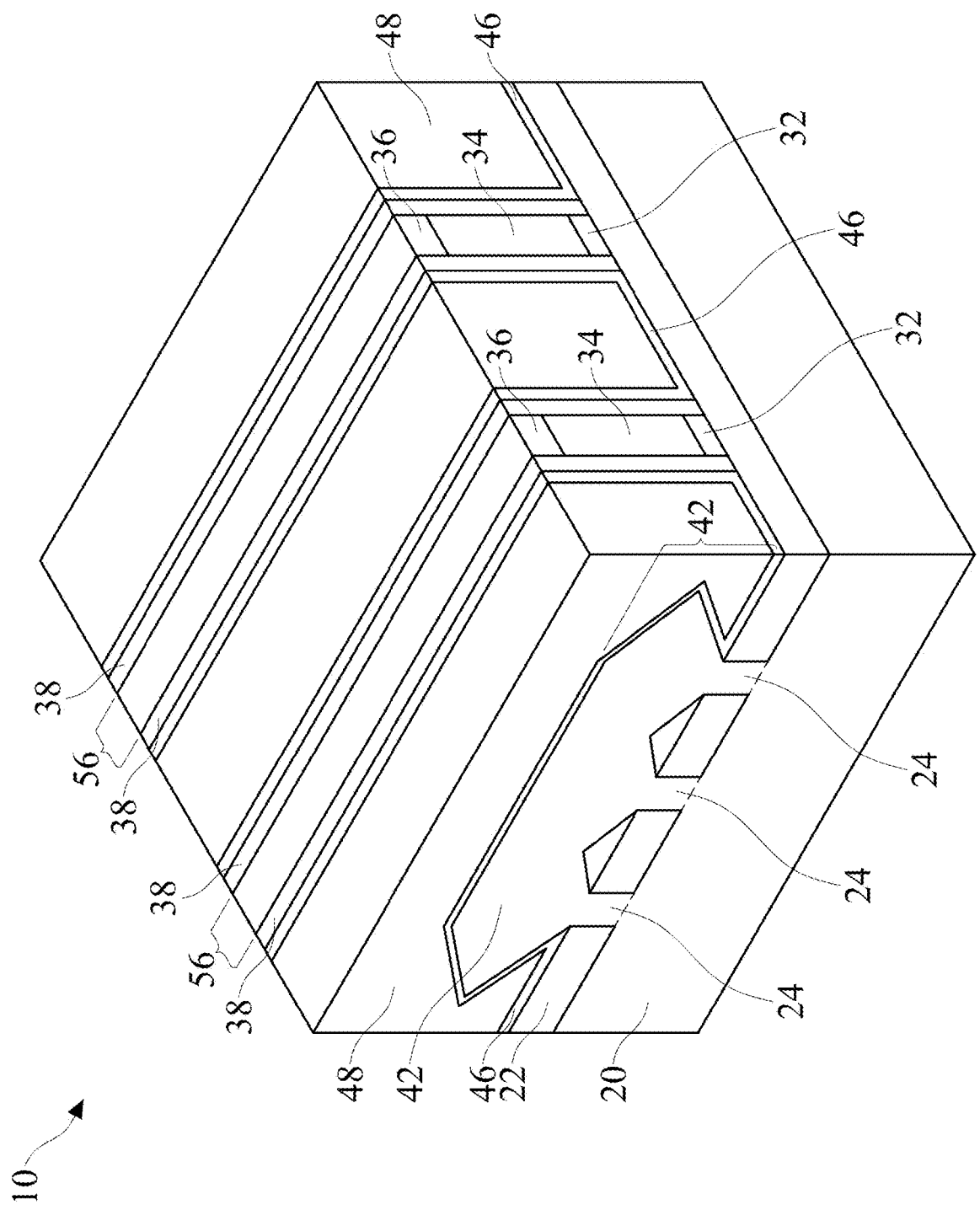

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 25. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8:
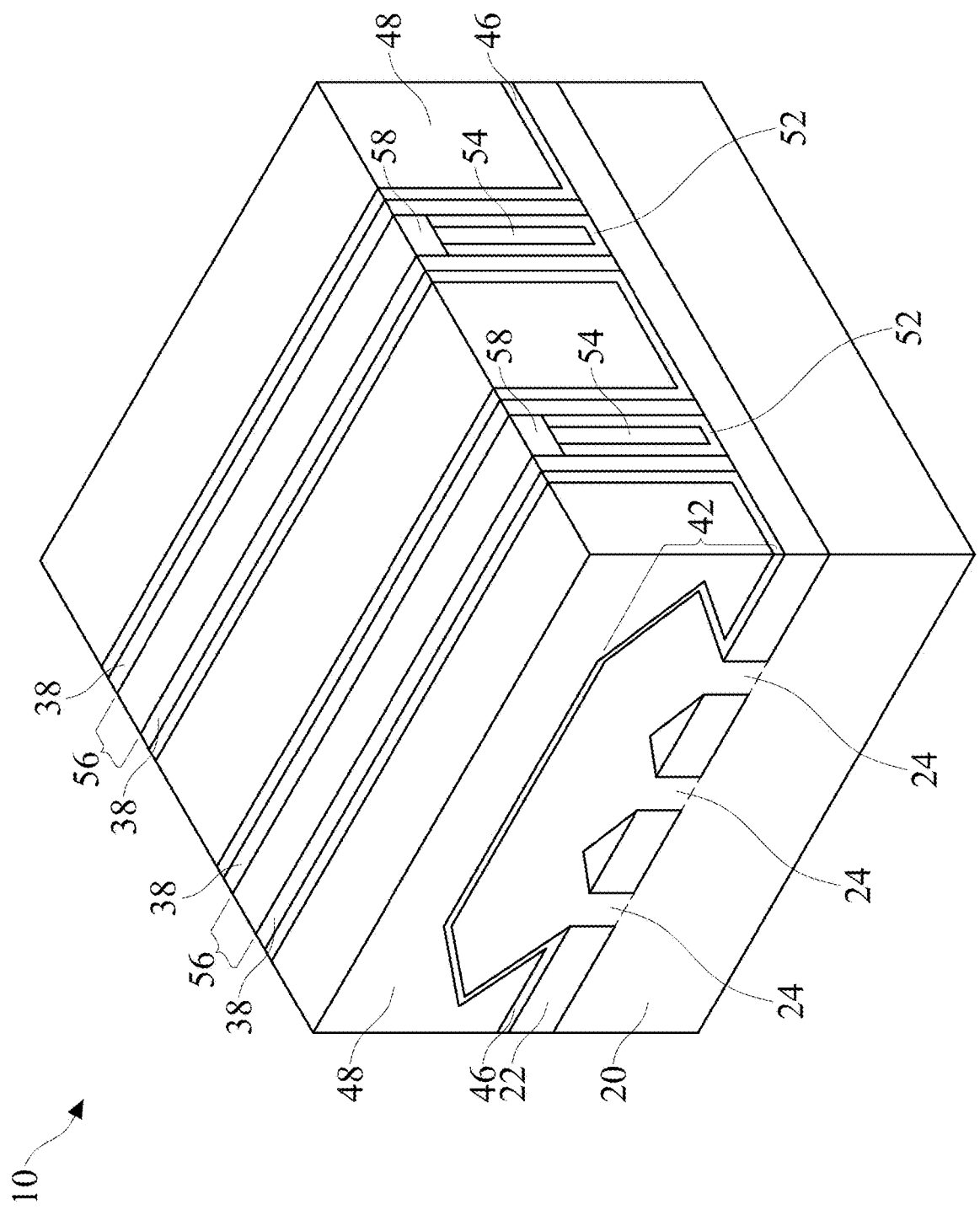

Next, dummy gate stacks 30, which include hard mask layers 36, dummy gate electrodes 34, and dummy gate dielectrics 32, are replaced with replacement gate stacks 56, which include metal gate electrodes 54 and gate dielectrics 52 as shown in FIG. 8. The respective process is illustrated as process 214 in the process flow 200 shown in FIG. 25. When forming replacement gate stacks 56, hard mask layers 36, dummy gate electrodes 34, and dummy gate dielectrics 32 as shown in FIG. 7 are first removed in one or a plurality of etching processes, resulting in trenches/openings to be formed between gate spacers 38. The top surfaces and the sidewalls of protruding semiconductor fins 24' are exposed to the resulting trenches.

Next, (replacement) gate dielectric layers 52 are formed, which extend into the trenches between gate spacers 38. In accordance with some embodiments of the present disclosure, each of gate dielectric layers 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 8, gate electrodes 54 are formed over gate dielectrics 52, Gate electrodes 54 include conductive sub-layers. The sub-layers are not shown separately, while the sub-layers are distinguishable from each other. The deposition of the sub-layers may be performed using a conformal deposition method(s) such as ALD or CVD.

The stacked conductive layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed.

The deposited gate dielectric layers and conductive layers are formed as conformal layers extending into the trenches, and include some portions over ILD 48. Next, a metallic material is deposited to fill the remaining trenches between gate spacers 38. The metallic material may be formed of tungsten or cobalt, for example. Subsequently, a planarization process such as a CMP process or a mechanical grinding process is performed, so that the portions of the gate dielectric layers, conductive sub-layers, and the metallic material over ILD 48 are removed. As a result, metal gate electrodes 54 and gate dielectrics 52 are formed. Gate electrodes 54 and gate dielectrics 52 are in combination referred to as replacement gate stacks 56. The top surfaces of replacement gate stacks 56, gate spacers 38, CESL 46, and ILD 48 may be substantially coplanar at this time.

FIG. 8 also illustrates the formation of (self-aligned) hard masks 58 in accordance with some embodiments. The respective process is illustrated as process 216 in the process flow 200 shown in FIG. 25. The formation of hard mask 58 may include performing an etching process to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxynitride, silicon oxy-carbo-nitride, or the like.

Figure 9A:
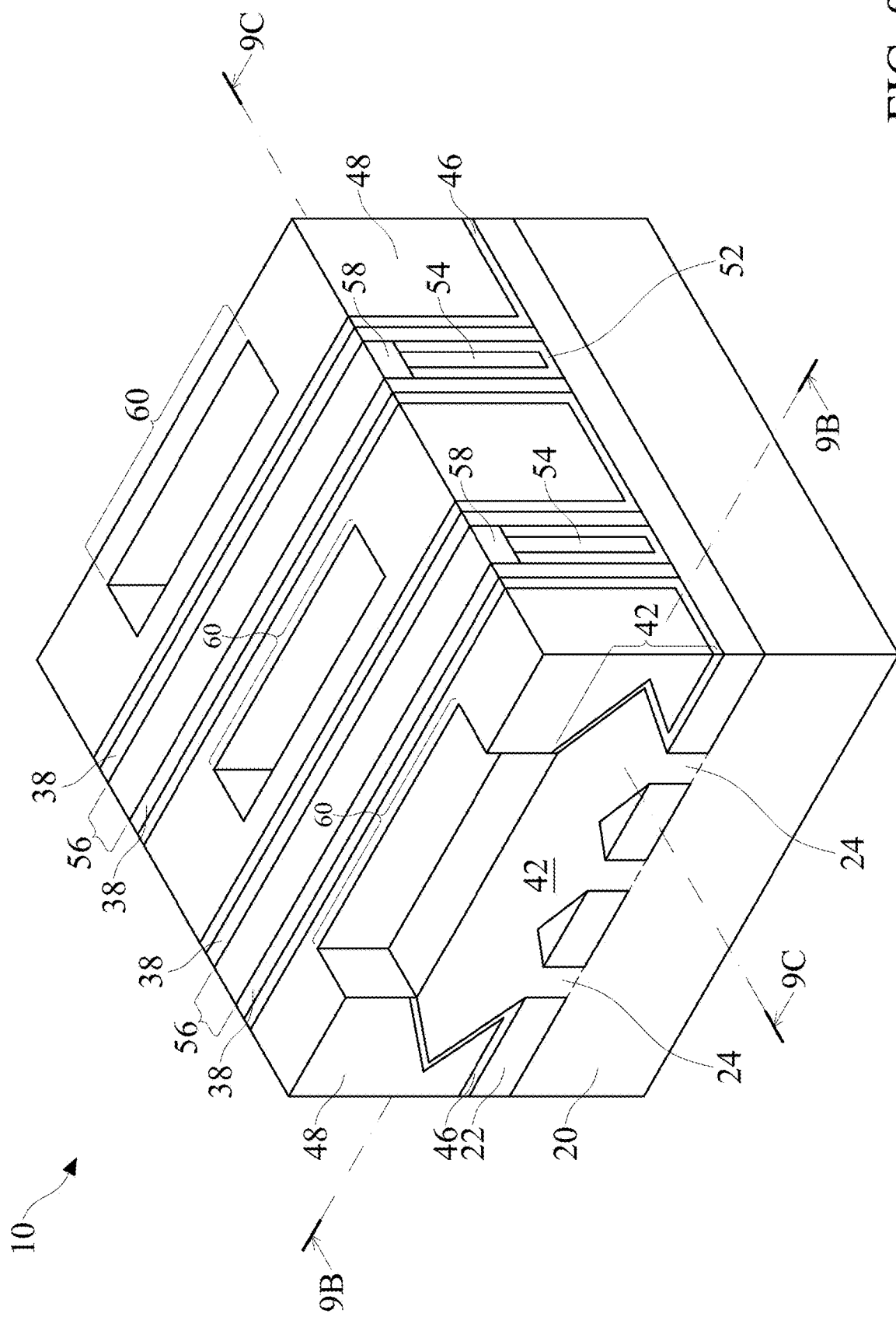

FIG. 9A illustrates the formation of source/drain contact openings 60. The respective process is illustrated as process 218 in the process flow 200 shown in FIG. 25. The formation of contact openings 60 include etching ILD 48 to expose the underlying portions of CESL 46, and then etching the exposed portions of CESL 46 to reveal epitaxy regions 42. In accordance with some embodiments of the present disclosure, as illustrated in FIG. 9A, gate spacers 38 are spaced apart from the nearest contact openings 60 by some remaining portions of ILD 48. In accordance with other embodiments, the sidewalls of contact openings 60 are exposed to contact openings 60.

Figure 9B:
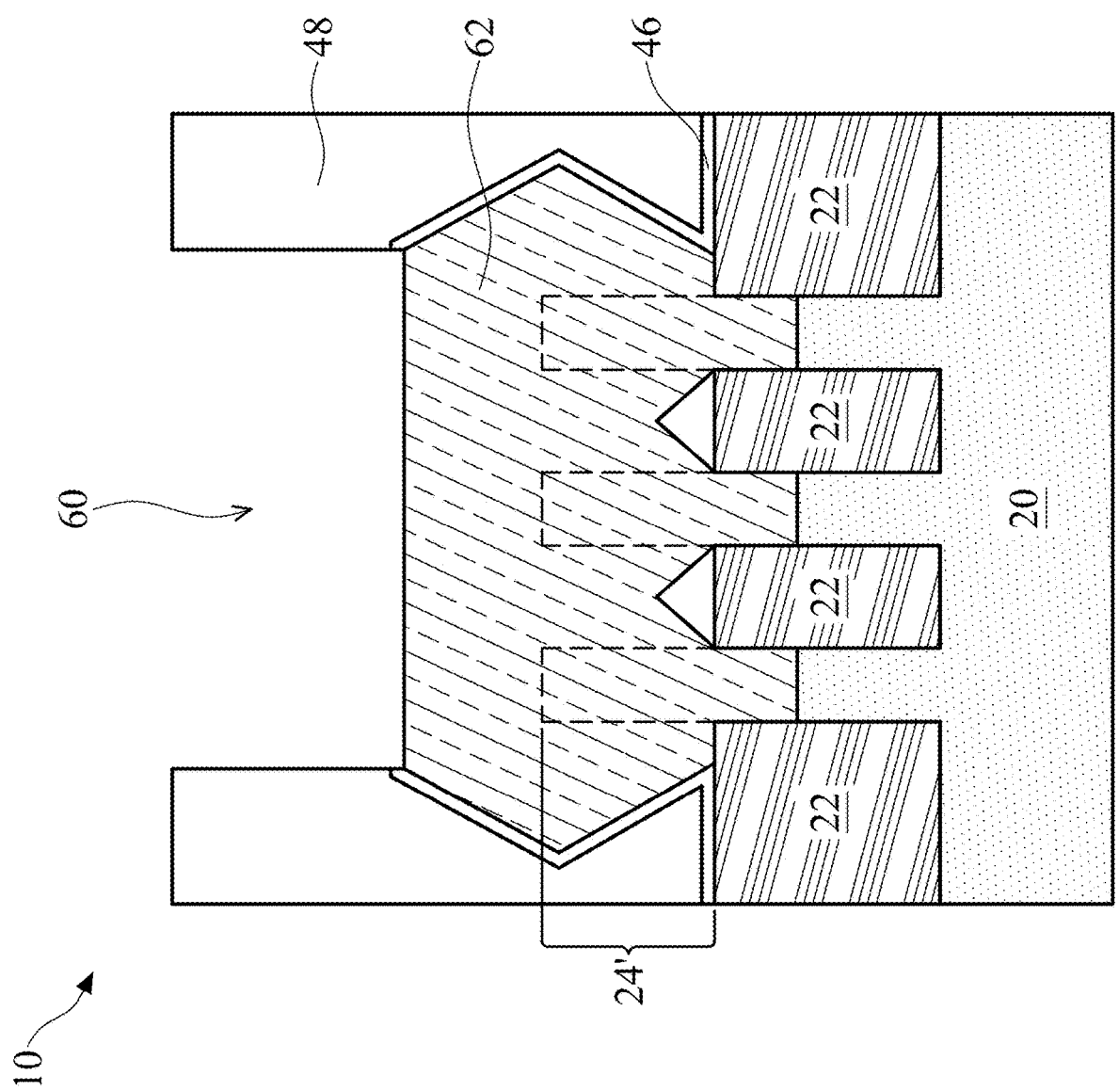
Figure 9C:
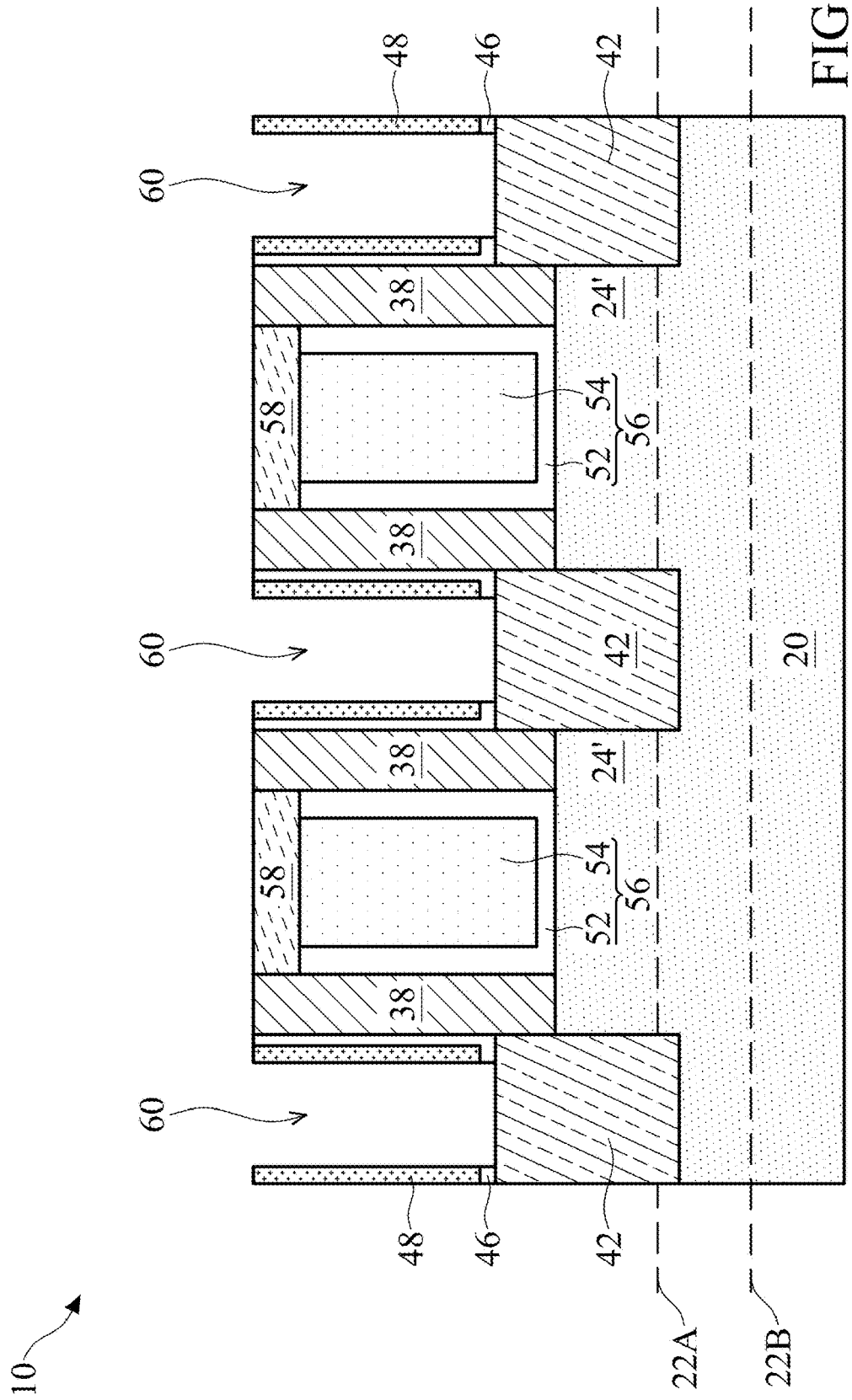

FIG. 9B illustrates a cross-sectional view showing the reference cross-section 9B-9B in FIG. 9A. FIG. 9C illustrates a cross-sectional view showing the reference cross-section 9C-9C in FIG. 9A. In FIG. 9C, the levels of the top surfaces 22A and bottom surfaces 22B of STI regions 22 are illustrated, and semiconductor fins 24' are over top surfaces 22A. Subsequently illustrated FIGS. 10 through 18 illustrate subsequent processes, and the illustrated cross-sections in FIGS. 10 through 18 are the same as the reference cross-section 9C-9C in FIG. 9A.

Figure 10:
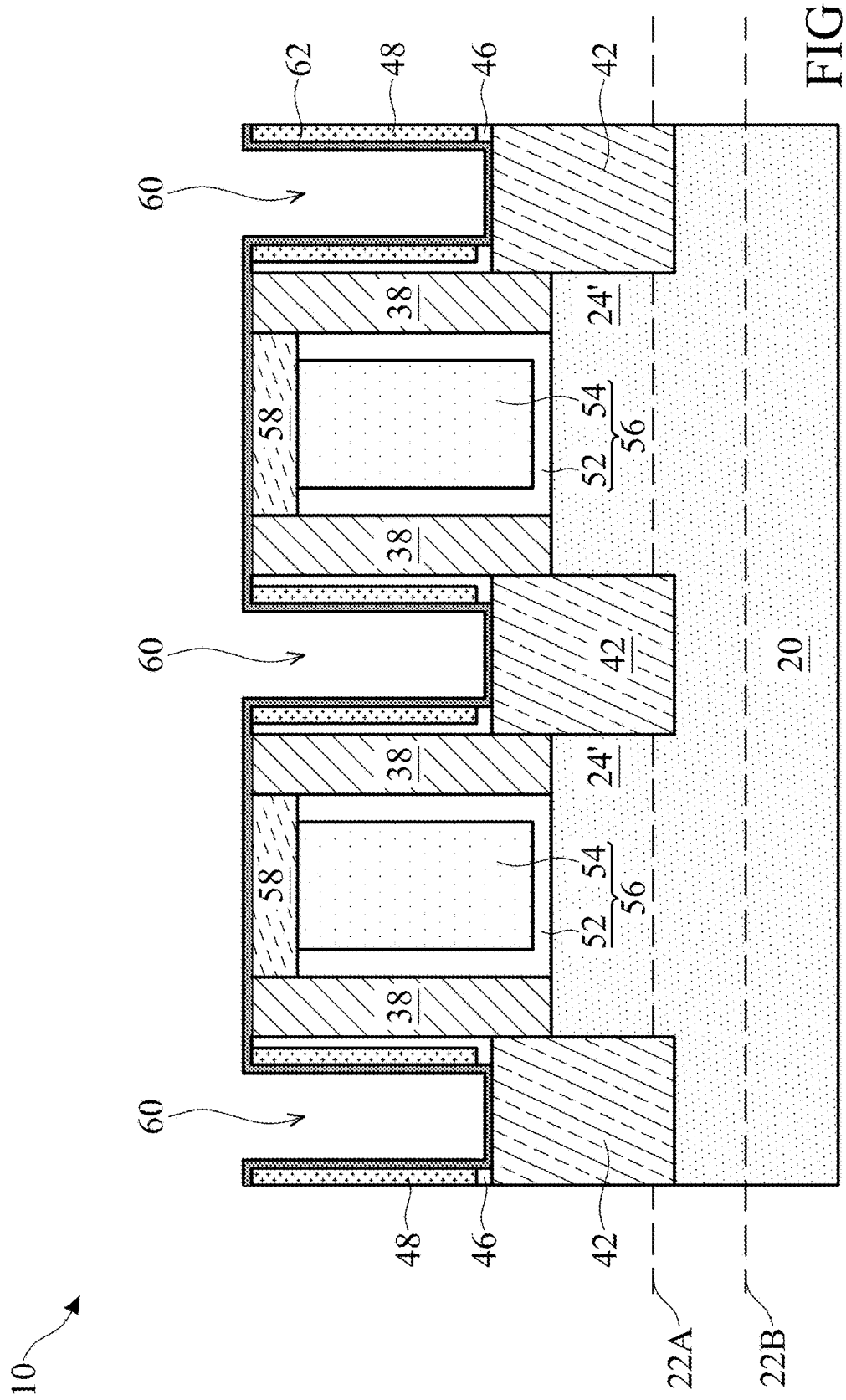
Figure 11:
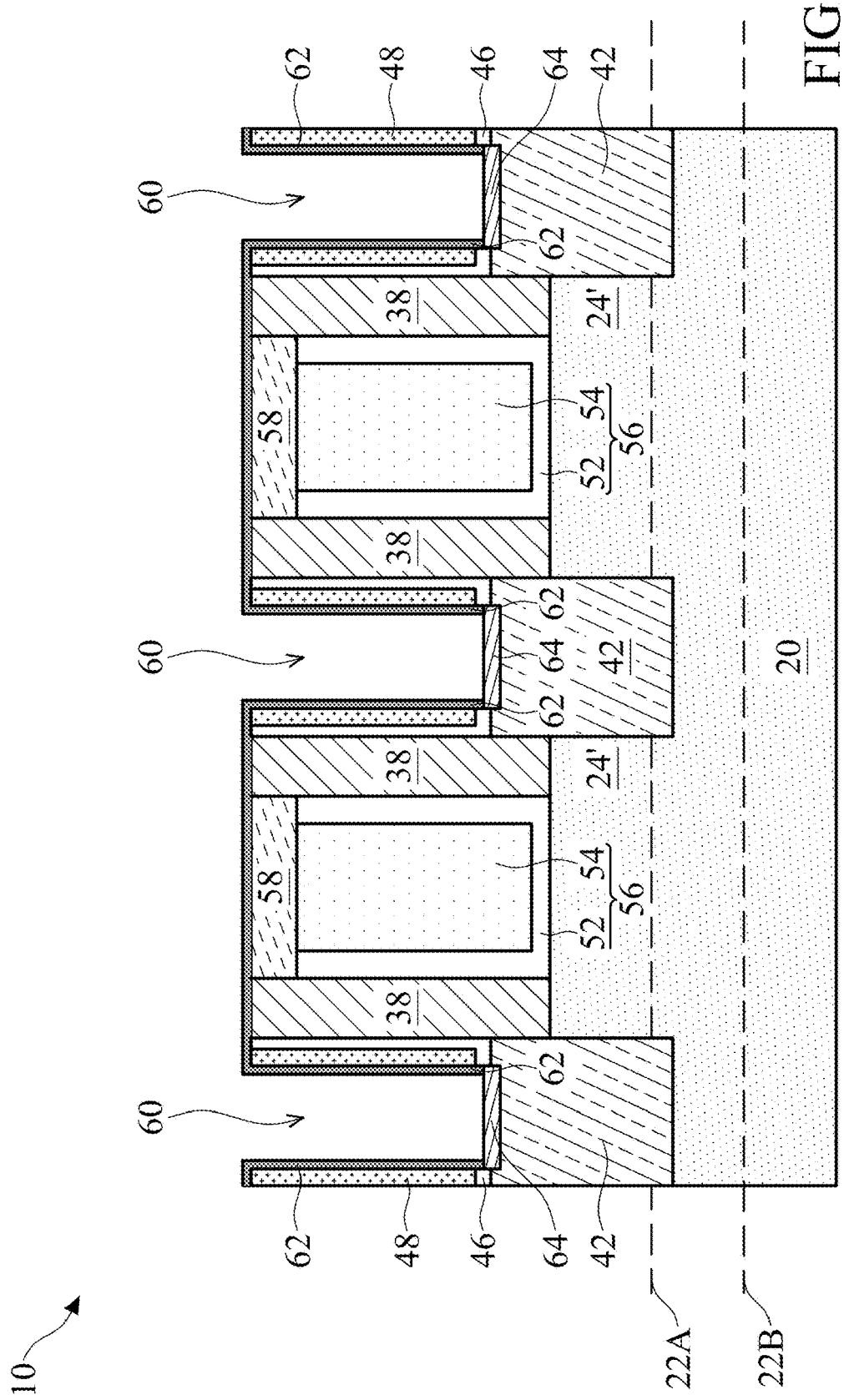

Referring to FIG. 10, metal layer 62 (such as a titanium layer or a cobalt layer) is deposited, for example, using Physical Vapor Deposition (PVD) or a like method. The respective process is illustrated as process 220 in the process flow 200 shown in FIG. 25. Metal layer 62 is a conformal layer, and extends onto the top surface of source/drain regions 42 and the sidewalls of ILD 48 and CESL 46, which sidewalls are exposed to openings 60. An anneal process is then performed to form source/drain silicide regions 64, as shown in FIG. 11. The respective process is illustrated as process 222 in the process flow 200 shown in FIG. 25. The anneal process may include a Rapid Thermal Anneal (RTA) anneal process, a furnace anneal process, or the like. Accordingly, the bottom portion of metal layer 62 reacts with source/drain region 42 to form silicide regions 64. The sidewall portions of metal layer 62 remain after the silicidation process. In accordance with some embodiments, the bottom portion of metal layer 62 is fully silicided, and the resulting silicide regions 64 are exposed to openings 60. In accordance with some embodiments, a portion of metal layer 62 may be left overlapping and contacting silicide regions 64.

Figure 12:
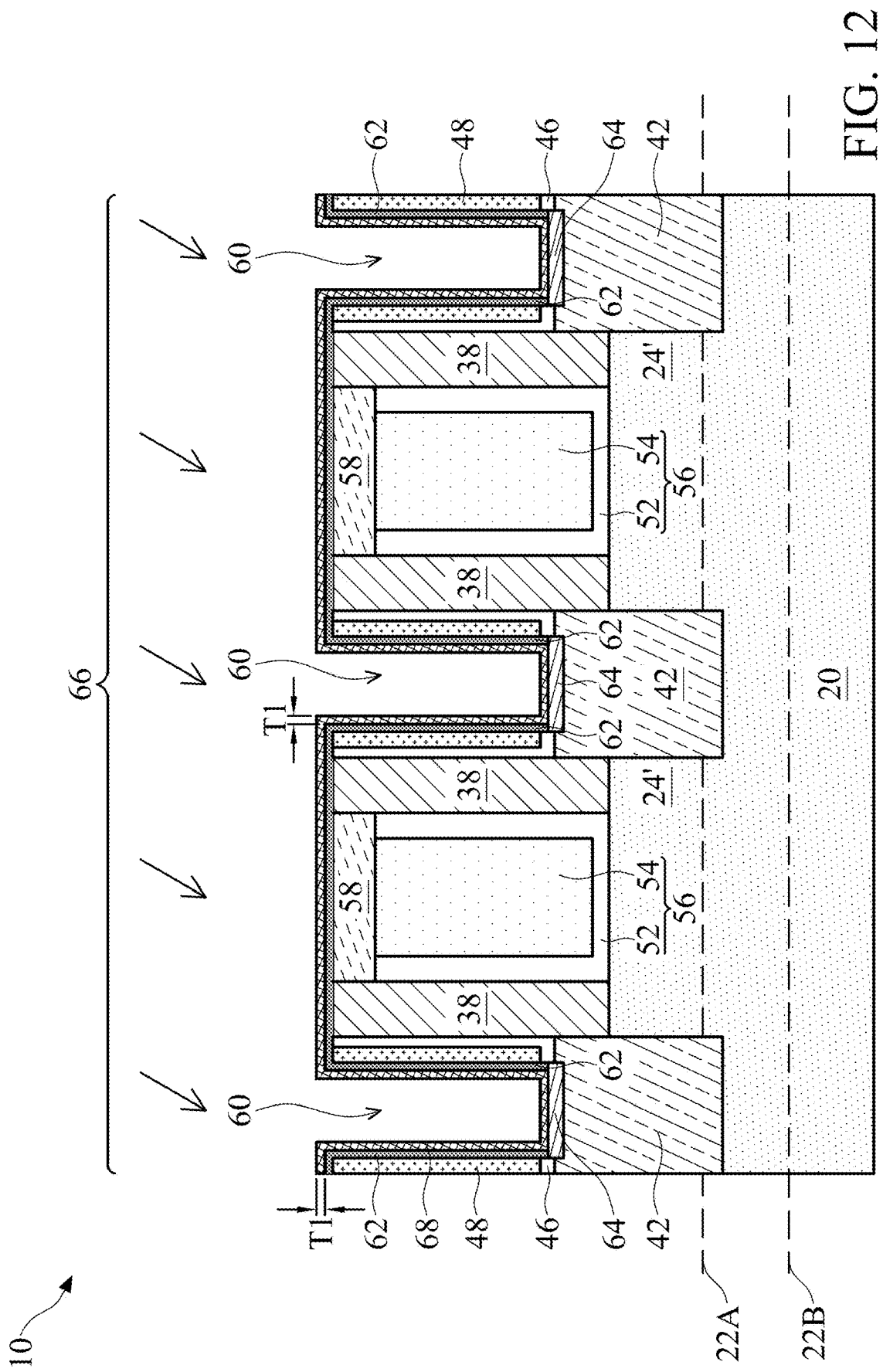

FIG. 12 illustrates a thermal soaking process 66, which is performed using a silicon-containing process gas such as silane ($SiH_4$), disilane ($Si_2H_6$), DichloroSilane (DCS, $H_2SiCl_2$), or the like. The respective process is illustrated as process 224 in the process flow 200 shown in FIG. 25. Carrier gases such as argon may be added. The thermal soaking process may be performed without plasma. In accordance with some embodiments of the present disclosure, the pressure of the thermal soaking process is in the range between about 10 Torr and about 100 Torr. The temperature of wafer 10 may be higher than about 200° C., and may be in the range between about 250° C. and about 350° C. The thermal soaking duration may be in the range between about 30 seconds and about 120 seconds.

The elevated temperature in the thermal soaking results in the dissociation of the silicon-containing process gas, which results in a mono silicon layer 68 (or several mono layers such as 2, 3, 4, or 5 mono silicon layers) attached to the exposed surfaces of wafer 10. The thickness T1 of the silicon layer 68 may be smaller than about 1 nm. As shown in FIG. 12, silicon layer 68 may be formed on the top surface of source/drain silicide regions 64 and metal layer 62.

Figure 13:
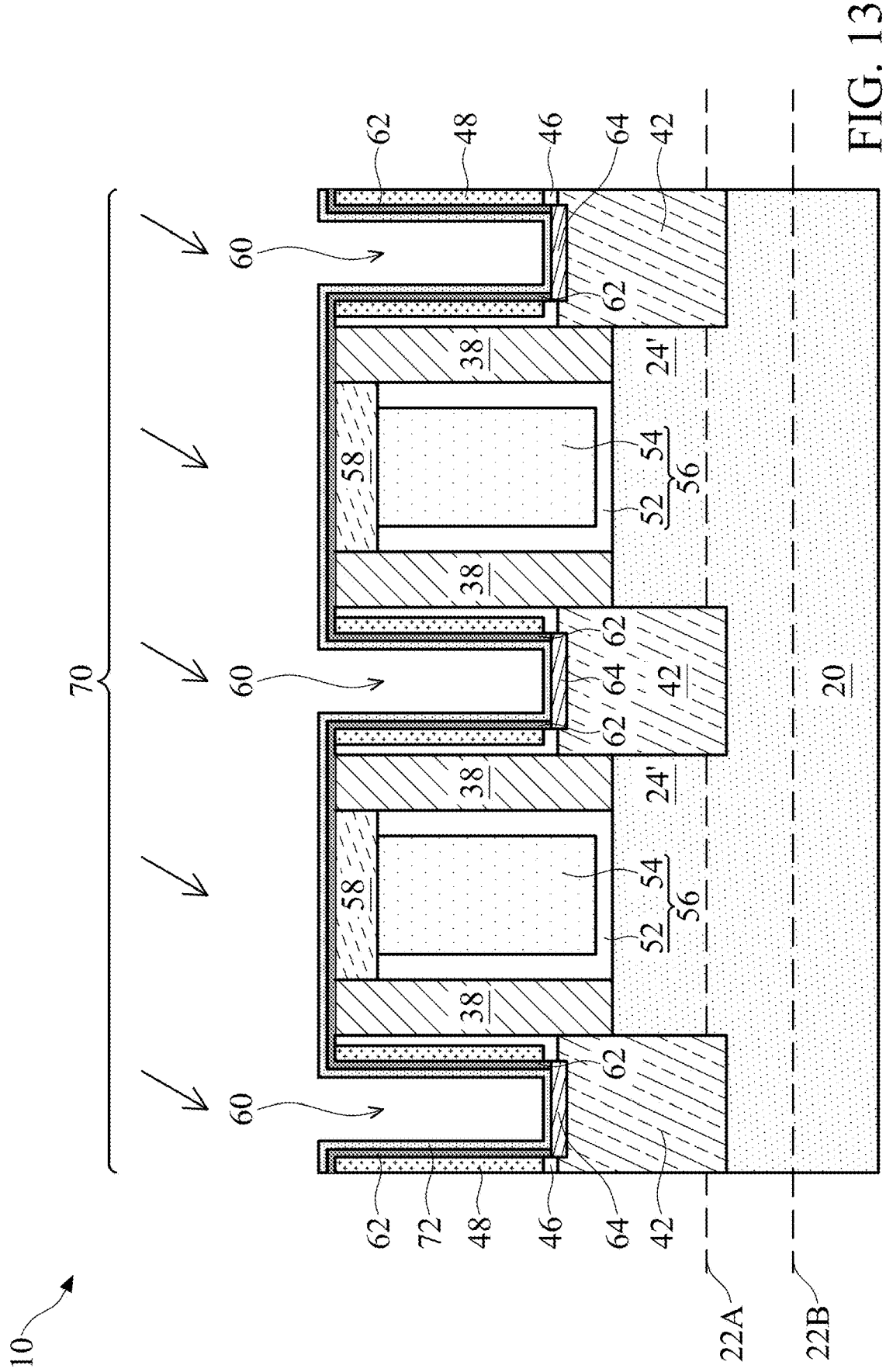

FIG. 13 illustrates plasma treatment process 70. The respective process is illustrated as process 226 in the process flow 200 shown in FIG. 25. In accordance with some embodiments, the plasma treatment process 70 is performed using process gases comprising hydrogen ($H_2$) and a nitrogen-containing gas. The nitrogen-containing gas may comprise $N_2$. Other types of nitrogen-containing gases such as ammonia ($NH_3$) may also be used. The treatment is performed with plasma being turned on. Also, direct plasma may be used, with the plasma generated in the same process chamber in which wafer 10 is placed for the plasma treatment process. In accordance with some embodiments of the present disclosure, the flow rate of hydrogen is in the range between about 10 sccm and about 50 sccm, and the flow rate of the nitrogen-containing gas is in the range between about 10 sccm and about 50 sccm. The treatment duration may be in the range between about 100 seconds and about 150 seconds. The temperature of wafer 10 during the plasma treatment may be room temperature (such as about 21° C.), or may be elevated and in the range between about 400° C. and about 450° C.

In the plasma treatment process, the hydrogen has the function of performing a reduction reaction on silicon atoms, thus generating dangling bonds for the silicon atoms of the silicon layer 68. It is thus easier for the nitrogen atoms in the nitrogen-containing gas to be bonded to the dangling bonds of the silicon atoms. Accordingly, Si—N bonds are generated. This results in SiN layer 72, which may be a mono-layer of Si—N, or may include several (such as 2, 3, 4, or 5) layers of SiN, to be generated. The Si—N has good adhesion to the underlying metal layer 62, and also has good adhesion to metal region 73 (FIG. 14) as formed subsequently. The thickness T2 of SiN layer 72 may be smaller than about 1 nm. SiN layer 72 is also a conformal layer, with the horizontal portions and vertical portions having a thickness variation smaller than about 20 percent, for example.

Figure 14:
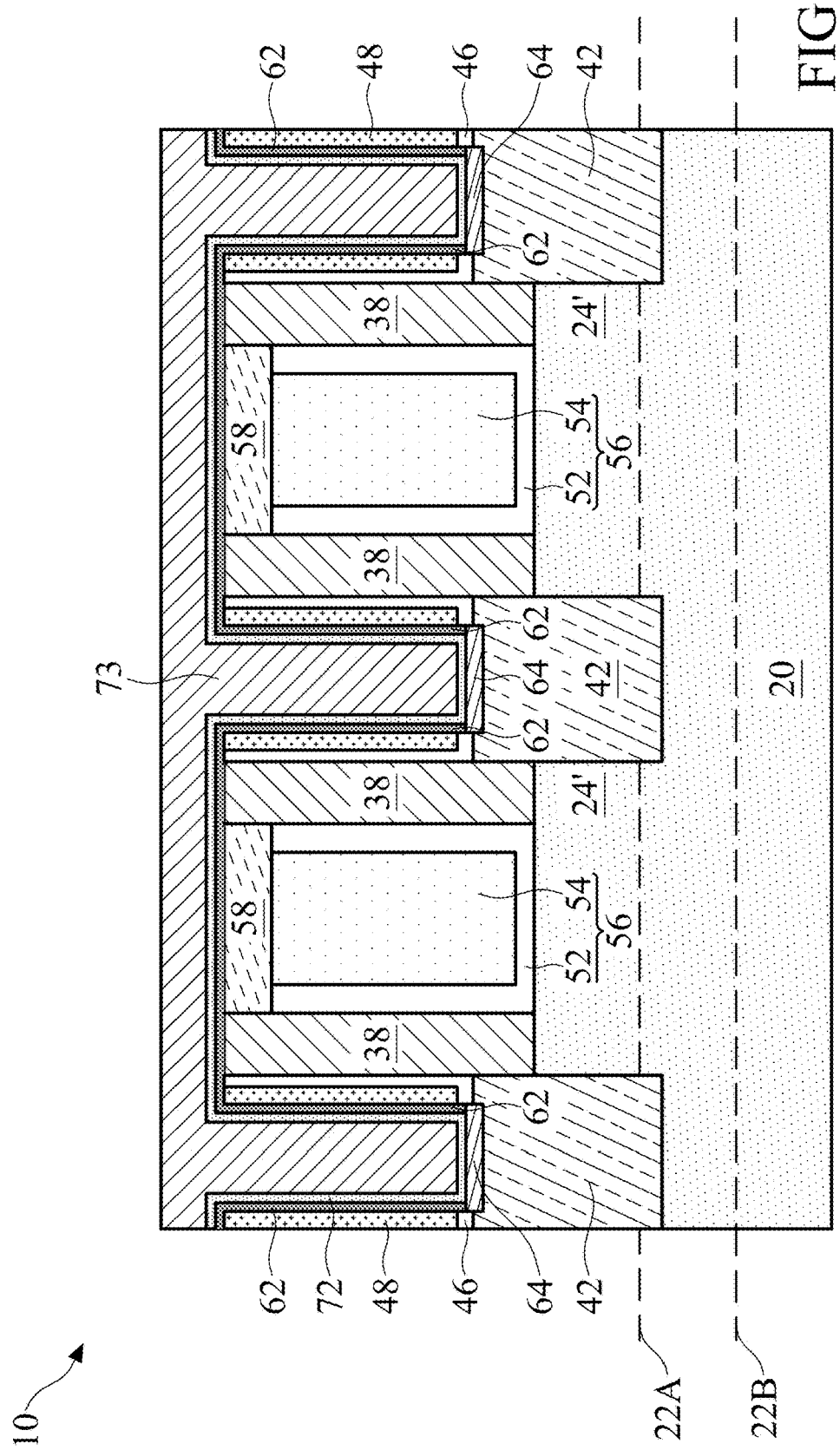

FIG. 14 illustrates the formation of metallic material 73, which includes a metal seed layer and the overlying metal region. The respective process is illustrated as process 228 in the process flow 200 shown in FIG. 25. In accordance with some embodiments, the metal seed layer is a cobalt layer or comprises cobalt. In accordance with other embodiments, tungsten, copper, molybdenum, or the like, may be used. The formation method may include Physical Vapor Deposition (PVD), ALD, or a PVD process followed by an ALD process. In accordance with some embodiments, an Electrical-Chemical Plating (ECP) is performed to plate a metal region on the metal seed layer and filling the remaining contact openings 60. The material of the metal region may be the same or different from that of the metal seed layer, and may be selected from cobalt, tungsten, copper, molybdenum, or the like, composite layers thereof, or alloys thereof.

The metal seed layer forms covalent bonds with the previously formed Si—N bonds, and hence Si—N-metal bonds are generated, which are conductive due to the small thickness of the Si—N bonds/layer. For example, when the metal seed layer comprises or is formed of cobalt, Si—N—Co bonds (in the form of a thin layer) may be formed. Si—N—Co has good adhesion to the underlying metal layer 62, and hence the bonding of contact plugs 74 to metal layer 62 is excellent.

In accordance with some embodiments, to effectively form Si—N bonds, and then bond the metal to the Si—N bonds, the processes shown in FIGS. 13 and 14, which includes the plasma treatment process (FIG. 13) and the formation of the metal seed layer (FIG. 14), are in-situ performed in the same process chamber, and without vacuum break therebetween. The in-situ performed plasma treatment and the formation of the metal seed layer ensure that the Si—N bonds are not connected with other elements such as oxygen (to form Si—N—O bonds, for example.), so that the dangling bonds of Si—N are available for metal atoms to be bonded thereon. In accordance with some embodiments, the thermal soaking process (FIG. 12) is also performed in-situ with the plasma treatment process (FIG. 13) and the formation of the metal seed layer (FIG. 14), so that a clean silicon layer is formed.

Figure 15:
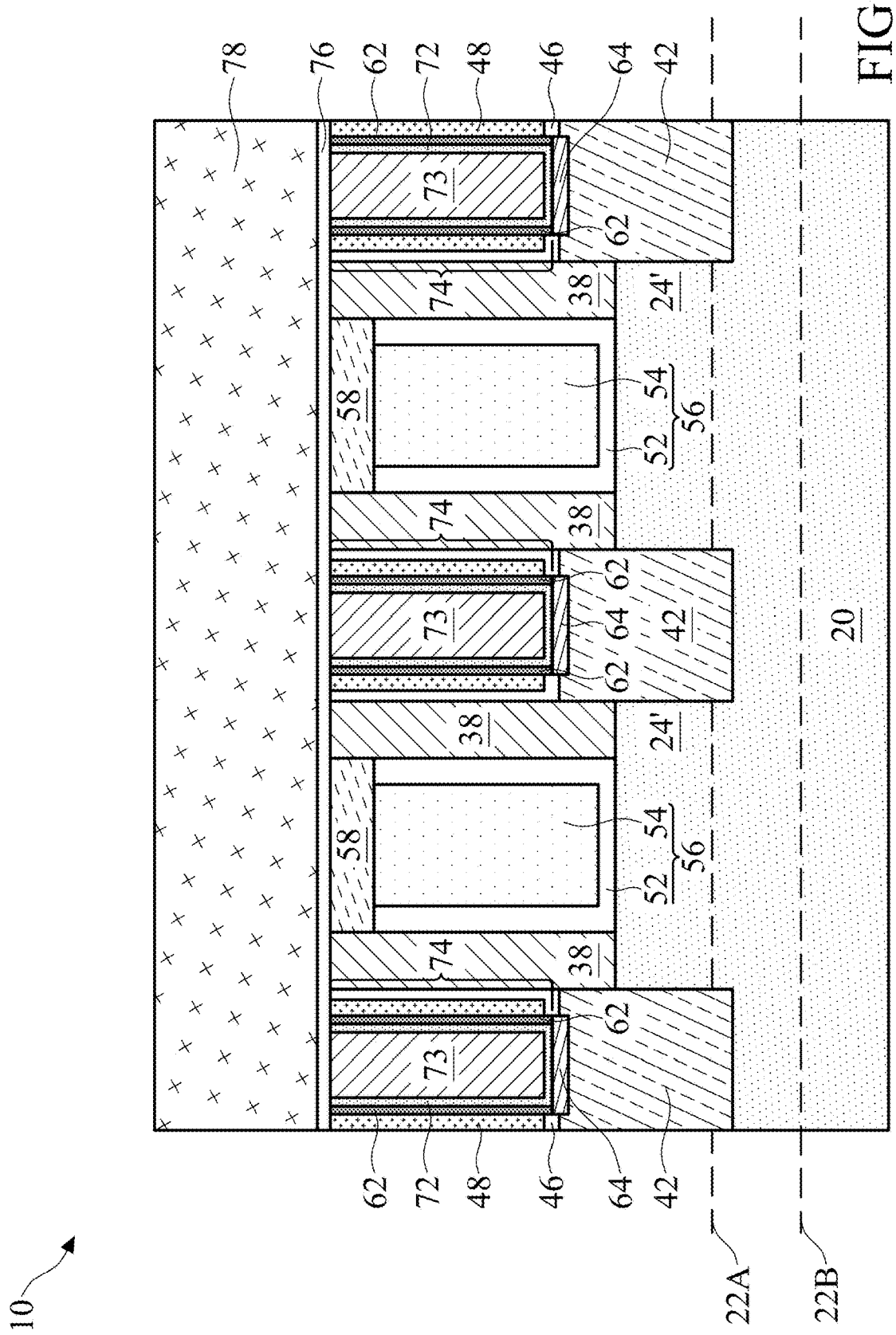
Figure 24:
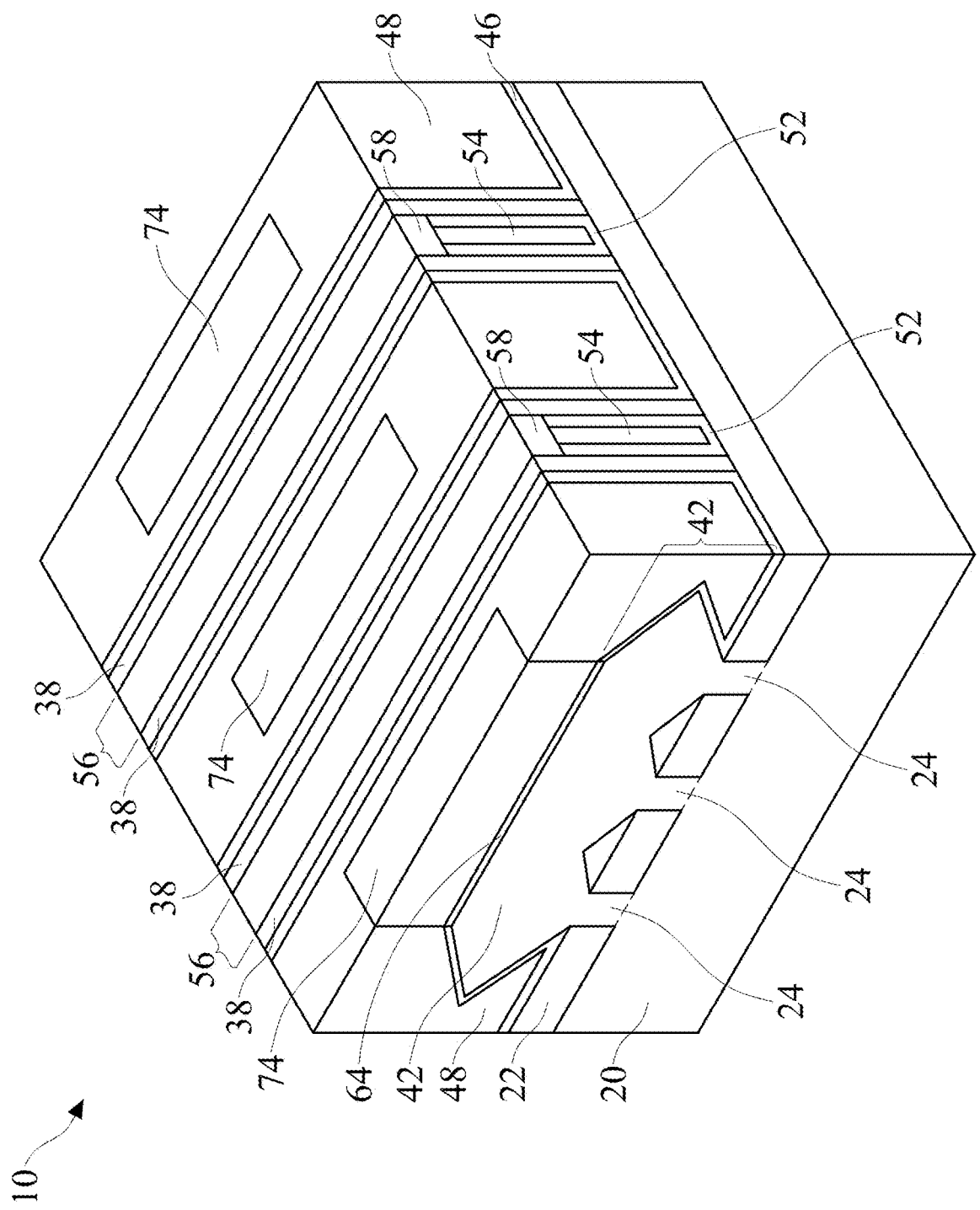
Figure 25:
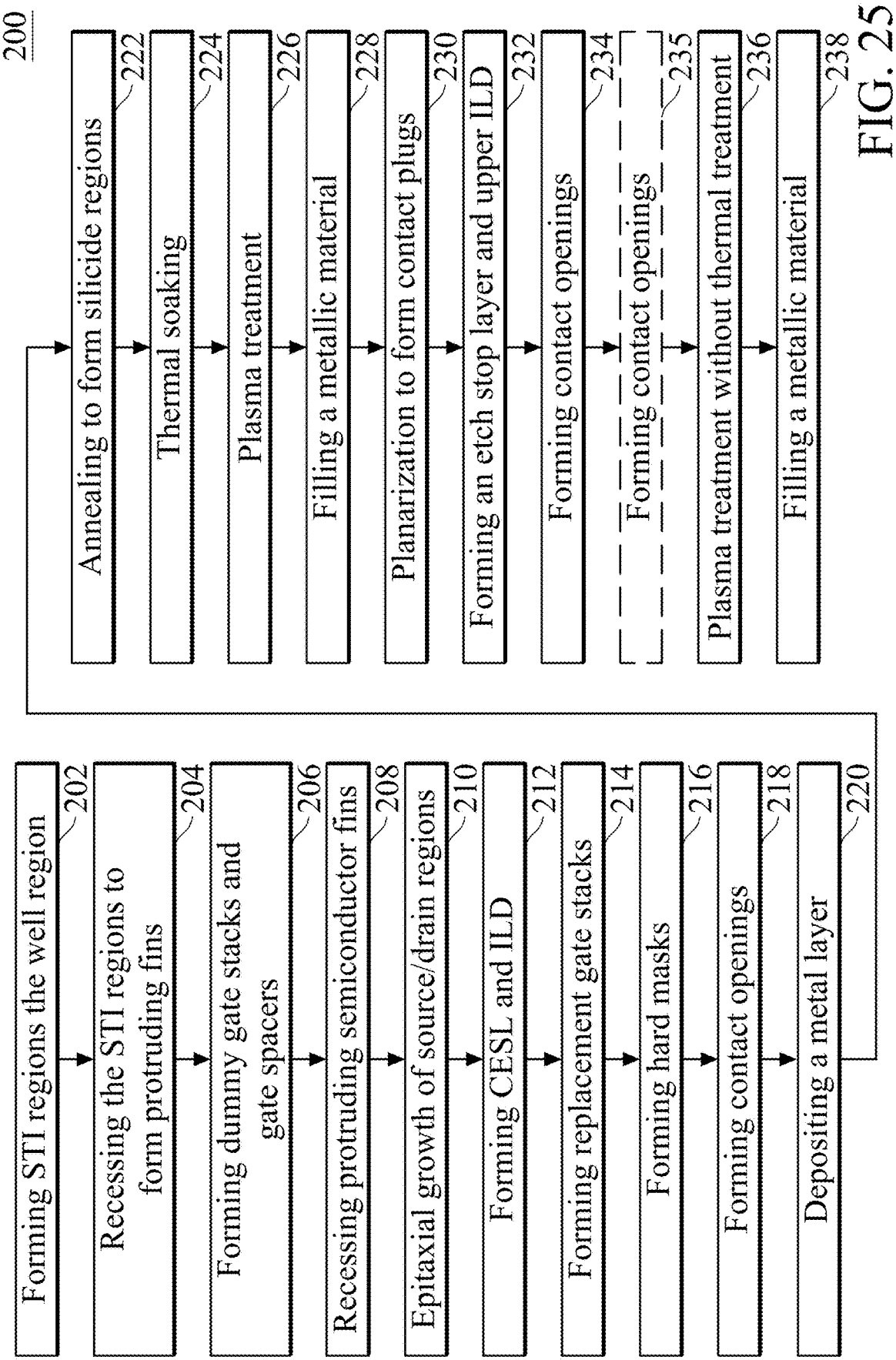
FIG. 25 illustrates a process flow for forming a transistor in accordance with some embodiments.

In a subsequent process, a planarization process such as a CMP process or a mechanical grinding process is performed to remove excess portions of metal layer 62 and metallic material 73, leaving contact plugs 74, which are shown in FIG. 15. The respective process is illustrated as process 230 in the process flow 200 shown in FIG. 25. A perspective view of the lower part of the structure shown in FIG. 15 is also shown in FIG. 24, except that etch stop layer 76 and ILD 78 are not shown in FIG. 24.

Further referring to FIG. 15, in accordance with some embodiments of the present disclosure, etch stop layer 76 is formed. Etch stop layer 76 may be formed of a silicon-containing material such as SiN, SiCN, SiC, SiOCN, or the like. The formation method may include PECVD, ALD, CVD, or the like. Next, ILD 78 is formed over etch stop layer 76. The formation of etch stop layer 76 and ILD 78 is illustrated as process 232 in the process flow 200 shown in FIG. 25. The material of ILD 78 may be selected from the same candidate materials (and methods) for forming ILD 48. For example, ILD 78 may include silicon oxide, PSG, BSG, BPSG, or the like, which includes silicon therein. In accordance with some embodiments, ILD 78 is formed using PECVD, FCVD, spin-on coating, or the like.

Figure 16:
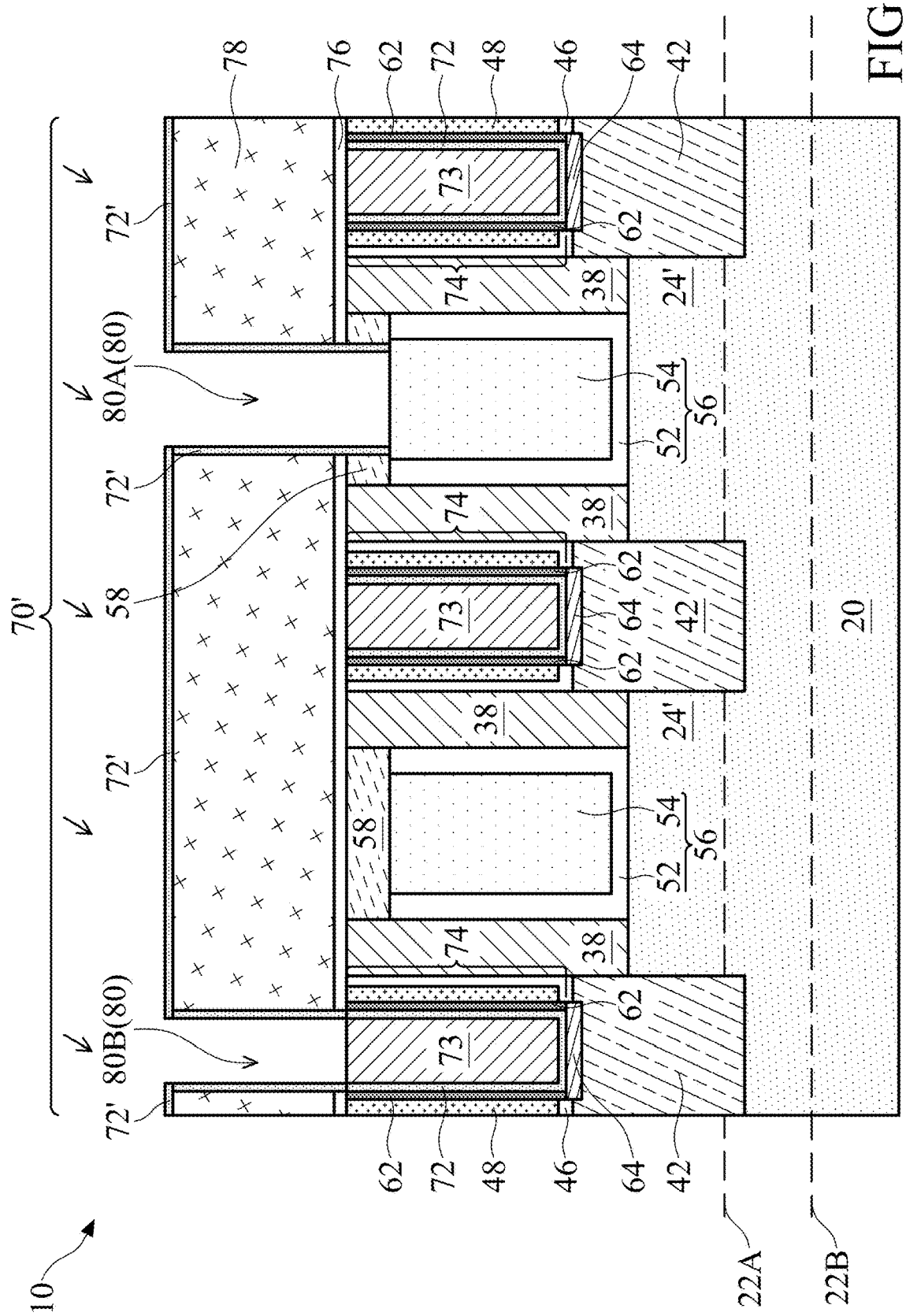

FIG. 16 illustrates the etching of ILD 78 and etch stop layer 76 to form upper source/drain contact openings 80A. The respective process is illustrated as process 234 in the process flow 200 shown in FIG. 25. Furthermore, ILD 78, etch stop layer 76, and hard masks 58 may be etched to form contact gate openings 80B. Gate openings 80B and source/drain contact openings 80A are collectively referred to as contact openings 80. Gate electrodes 54 and source/drain contact plugs 74 are thus exposed to gate openings 80B and source/drain contact openings 80A, respectively.

Next, another plasma treatment process 70', which is similar to the plasma treatment process as shown in FIG. 13, is performed to form SiN layer 72'. The respective process is illustrated as process 236 in the process flow 200 shown in FIG. 25. In accordance with some embodiments of the present disclosure, the plasma treatment process 70' is performed using a process gas comprising hydrogen ($H_2$) and a nitrogen-containing gas. The nitrogen-containing gas may comprise $N_2$, ammonia ($NH_3$), or the like. The treatment is performed with plasma turned on. Also, direct plasma may be used, with the plasma generated in the same process chamber in which wafer 10 is placed for the plasma treatment process. In accordance with some embodiments of the present disclosure, the flow rate of hydrogen is in the range between about 10 sccm and about 50 sccm, and the flow rate of the nitrogen-containing gas is in the range between about 10 sccm and about 50 sccm. The treatment duration may be in the range between about 100 seconds and about 150 seconds. The temperature of wafer 10 during the plasma treatment may be room temperature (such as about 21° C.), or may be elevated and in the range between about 400° C. and about 450° C.

In accordance with some embodiments, between the formation of openings 80 and the plasma treatment process 70', no thermal soaking process using silicon-containing process (es) is performed. Since ILD 78, etch stop layer 76, and hard masks 58 may be formed of silicon-containing materials, the silicon atoms in ILD 78, etch stop layer 76 and hard masks 58 are reduced (in a reduction reaction) by the hydrogen gas to form dangling bonds for silicon atoms, and the dangling bonds are then connected with nitrogen atoms. Accordingly, Si—N bonds are formed. In these embodiments, the silicon atoms in the Si—N bonds are parts of the ILD 78, etch stop layer 76, and hard masks 58. On the other hand, since the exposed surfaces of contact plugs 74 and gate electrodes 54 (comprising cobalt, for example) may not include silicon, SiN layer 72' may not extend on the top surfaces of contact plugs 74 and gate electrodes 54.

In accordance with alternative embodiments in which ILD 78, etch stop layer 76, and/or hard masks 58 do not include silicon, or include silicon, but the silicon atomic percentages are negligible, the thermal soaking process is performed before the plasma treatment process 70'. The respective process is illustrated as process 235 in the process flow 200 shown in FIG. 25. Process 235 is shown using a dashed box to indicate it may be performed or may be skipped. The process conditions may be similar to that of the thermal soaking process 66 in FIG. 12, and hence are not repeated herein. The resulting structure is similar to what is shown in FIG. 16, except between SiN layer 72' and the dielectric layers including ILD 78, etch stop layer 76, and hard masks 58, there forms a silicon layer similar to silicon layer 68 as shown in FIG. 12. Due to the diffusion, the silicon layer will be in the form of compounds of silicon with the adjacent layers such as ILD 78, etch stop layer 76, and hard masks 58. The parts of the silicon layer may be observable when the silicon atomic percentages of the compounds of the corresponding parts are higher than that any one of ILD 78, etch stop layer 76, and/or hard masks 58. The silicon layer may not be observable if the silicon atom percentages in SiN layer 72' and in ILD 78, etch stop layer 76, and hard masks 58 are high. In accordance with some embodiments of the present disclosure, after the plasma treatment, the deposited silicon layer is converted to SiN layer 72'. SiN layer 72' in accordance with these embodiments may extend on the top surfaces of contact plugs 74 and gate electrodes 54.

Figure 17:
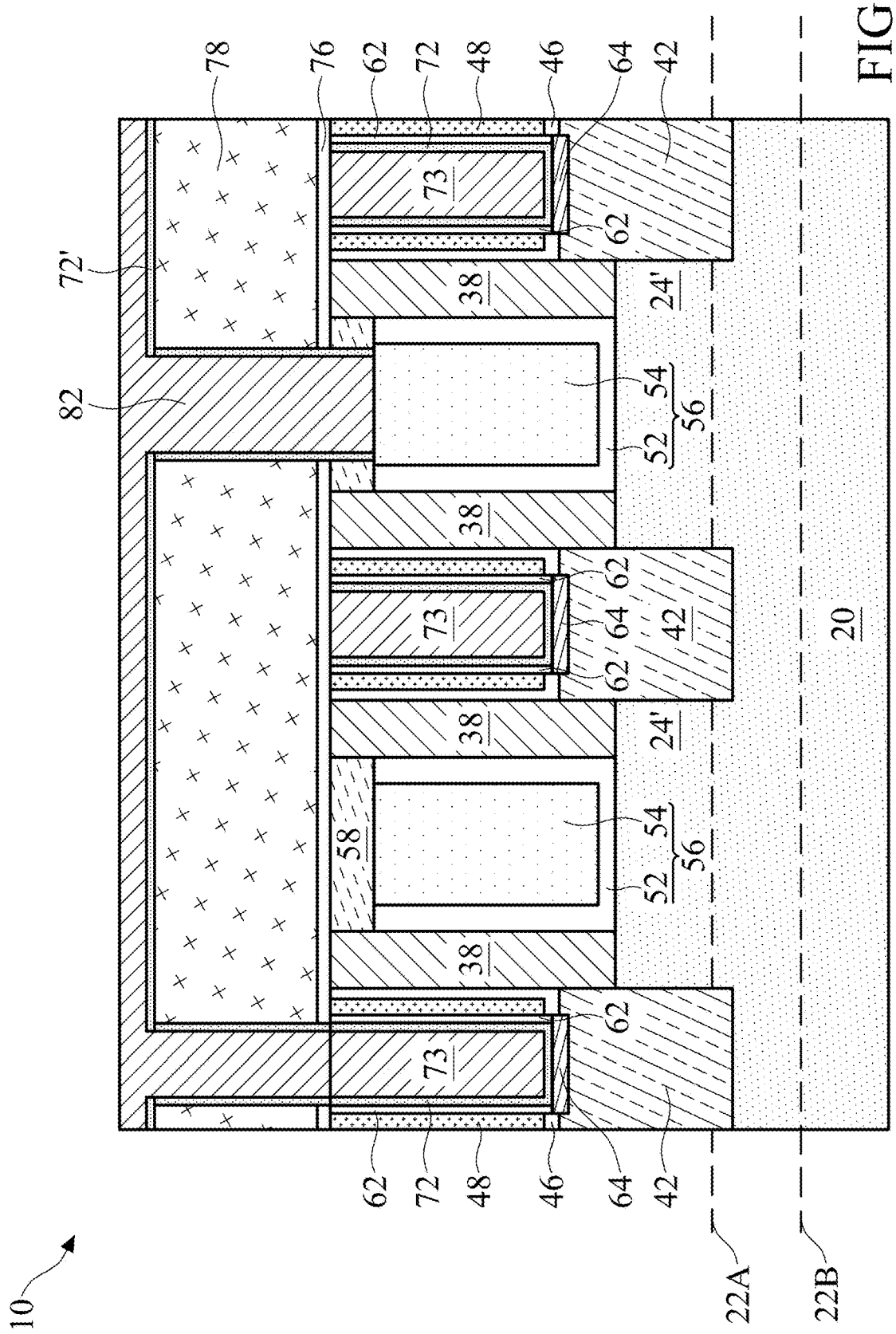

FIG. 17 illustrates the deposition of metallic material 82, which may be deposited using PVD, CVD, plating, combinations thereof, or the like, which forms Si—N-metal bonds with SiN layer 72'. The respective process is illustrated as process 238 in the process flow 200 shown in FIG. 25. Metallic material 82 may include cobalt, tungsten, molybdenum, copper, or alloys thereof. In accordance with some embodiments of the present disclosure, at least the bottom portion (for example, a seed layer) of metallic material 82 is formed in-situ with the plasma treatment process 70' (FIG. 16) to ensure the effective formation of Si—N-metal bonds. In a subsequent process, a planarization process such as a CMP process or a mechanical grinding process is performed to remove excess portions of metallic material 82 and SiN layer 72', hence forming upper contact plugs 84. The resulting structure is shown in FIG. 18.

Figure 18:
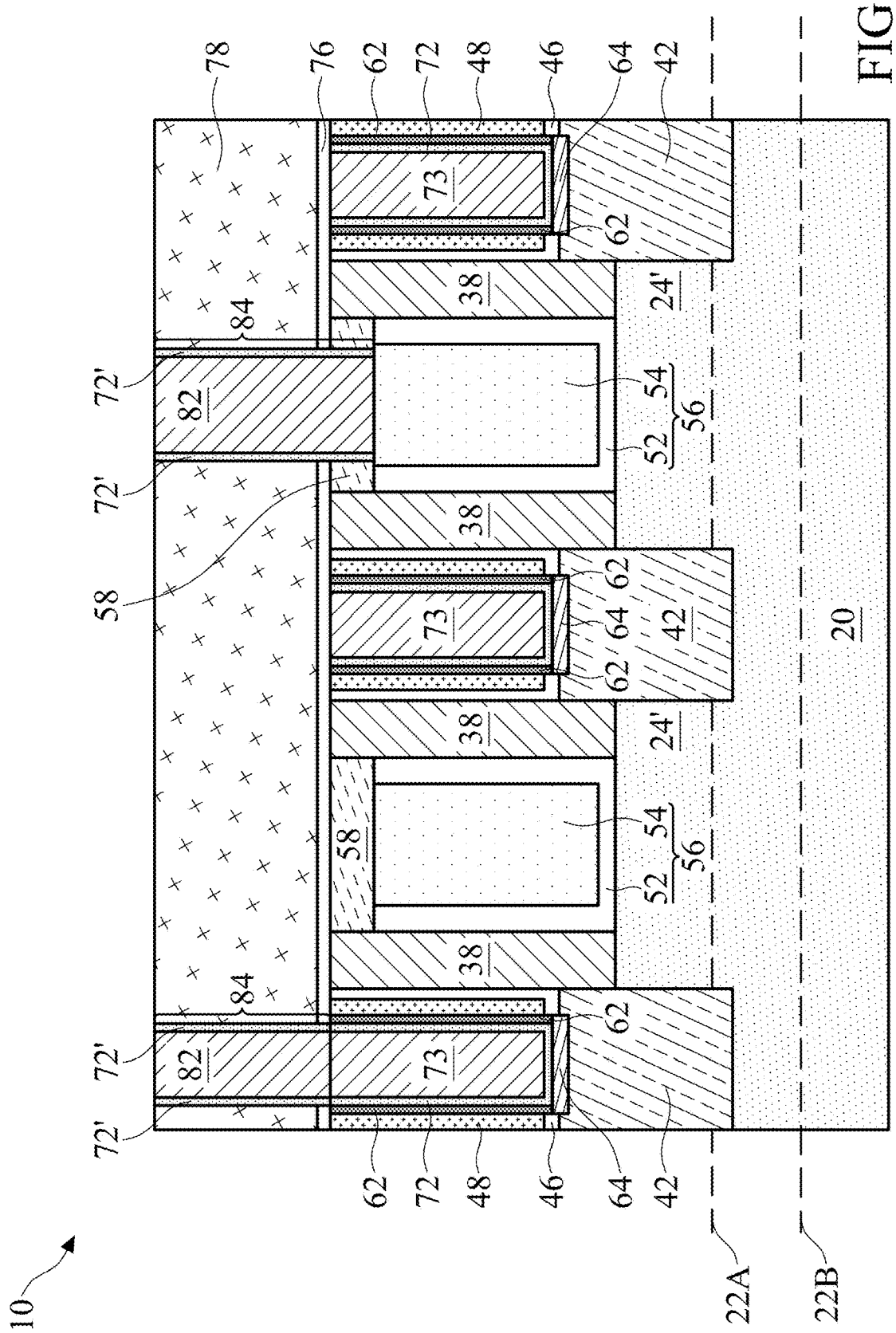
Figure 19:
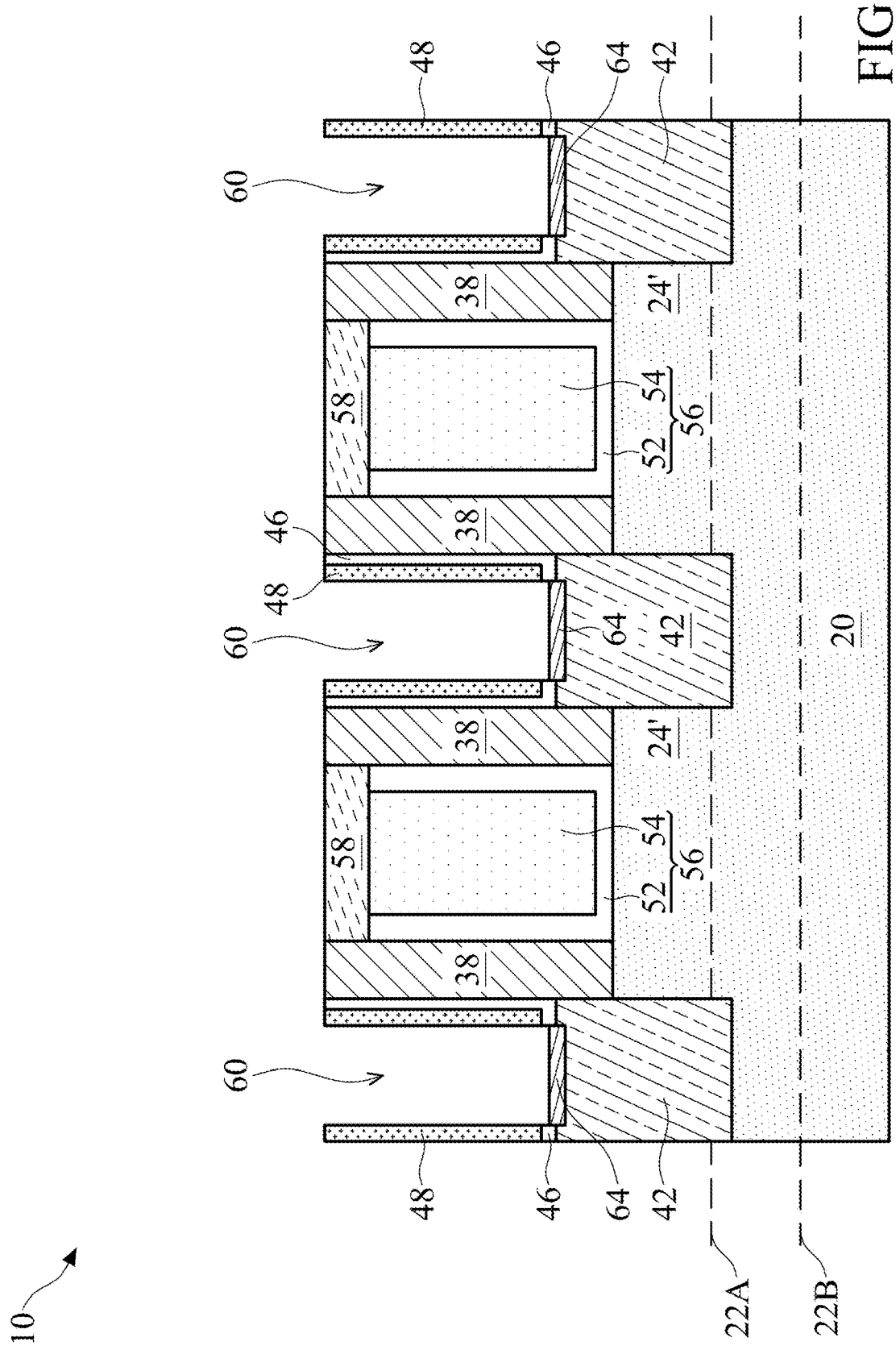
FIGS. 19 through 23 are cross-sectional views of intermediate stages in the formation of a transistor and the respective contact plugs in accordance with some embodiments.

As shown in FIG. 18, metal layer 62 forms a ring (in a plane view) encircling metal region 73. Metal layer 62 and metal region 73 may be formed of the same metal or different metals. Si-and-N-containing layer 72 is between metal region 73 and metal layer 62, both of which may be free from silicon therein when they are formed. Accordingly, in the final structure, Si-and-N-containing layer 72 is observed as a silicon-and-nitrogen rich layer, with both of silicon and nitrogen having higher atomic percentages than in metal layer 62 and metal region 73, regardless of whether silicon and nitrogen diffuse into metal layer 62 and metal region 73 in subsequent processes or not. Also, due to the existence of the bottom portion of layer 72 directly over and contacting silicide region 64, the nitrogen atomic percentage in layer 72 may be higher than both of the overlying metal region 73 and the underlying silicide region 64. In the embodiments as illustrated, contact plugs 74 do not include a deposited barrier layer (for example, a TiN layer).

In the embodiments as shown in FIGS. 1-8, 9A, 9B, and 10-18, the metal layer 62 is left unremoved after the anneal process for forming silicide regions 64. Since the remaining metal layer 62 prevents the silicon atoms (if any) in ILD 48 and CESL 46 to be exposed to the plasma treatment process, the thermal soaking process (FIG. 12) is performed to form a silicon layer 68. FIGS. 19 through 23 illustrate cross-sectional views of intermediate stages in the formation of a FinFET and the corresponding contact plugs in accordance with some embodiments of the present disclosure, in which the exposed layer comprises silicon, and hence the thermal soaking process may be skipped. Unless specified otherwise, the materials and the formation processes of the components in these embodiments are essentially the same as the like components, which are denoted by like reference numerals in the preceding embodiments shown in FIGS. 1-8, 9A, 9B, and 10-18. The details regarding the formation process and the materials of the components shown in FIGS. 19 through 23 may thus be found in the discussion of the preceding embodiments.

The initial process are essentially the same as what are shown in FIGS. 1-8, 9A, 9B, 10, and 11, in which an anneal process is performed to form silicide regions 64. Next, the un-reacted portions of metal layer 62 are removed in an etching process, resulting in the structure shown in FIG. 19. Silicide regions 64 are not etched. The top surface and the sidewalls of ILD 48 (and possibly the sidewalls of CESL 46) are thus exposed.

Figure 20:
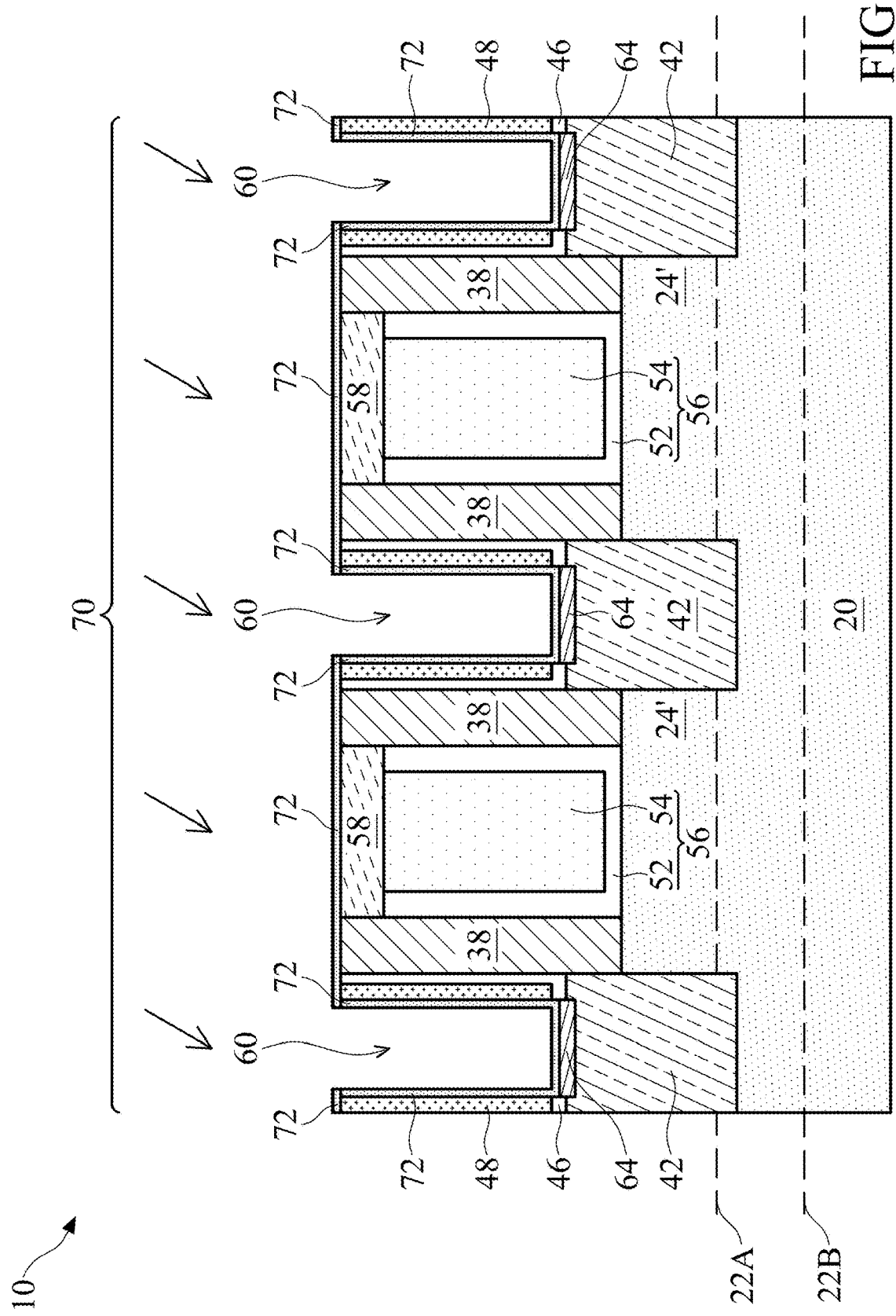

Next, as shown in FIG. 20, plasma treatment process 70 is performed to form SiN layer 72 (a silicon-and-nitrogen-containing layer), which is formed by attaching nitrogen atoms to a surface layer of ILD and possibly CESL 46. In accordance with some embodiments, ILD 48 (and possibly CESL 46) is formed of a silicon-containing compound, and hence contains silicon therein. Accordingly, plasma treatment process 70 is performed without a preceding thermal soaking process using a silicon-containing process gas. Since the silicon atoms in the Si—N bonds are parts of ILD 48 and perhaps CESL 46, the bonding of SiN layer 72 to ILD 48 and CESL 46 is strong. The process conditions of the plasma treatment process 70 may be essentially the same as discussed referring to FIG. 13, and are not repeated herein.

In accordance with other embodiments, the thermal soaking process (using silicon-containing process gas) is also performed to add silicon atoms, followed by the plasma treatment process 70 in FIG. 13. The thermal soak process may be essentially the same as process 66 in FIG. 12. The thermal soaking process may be performed when ILD 48 and CESL 46 do not include silicon therein, or when the silicon atomic percentages in ILD 48 and CESL 46 are low.

Figure 21:
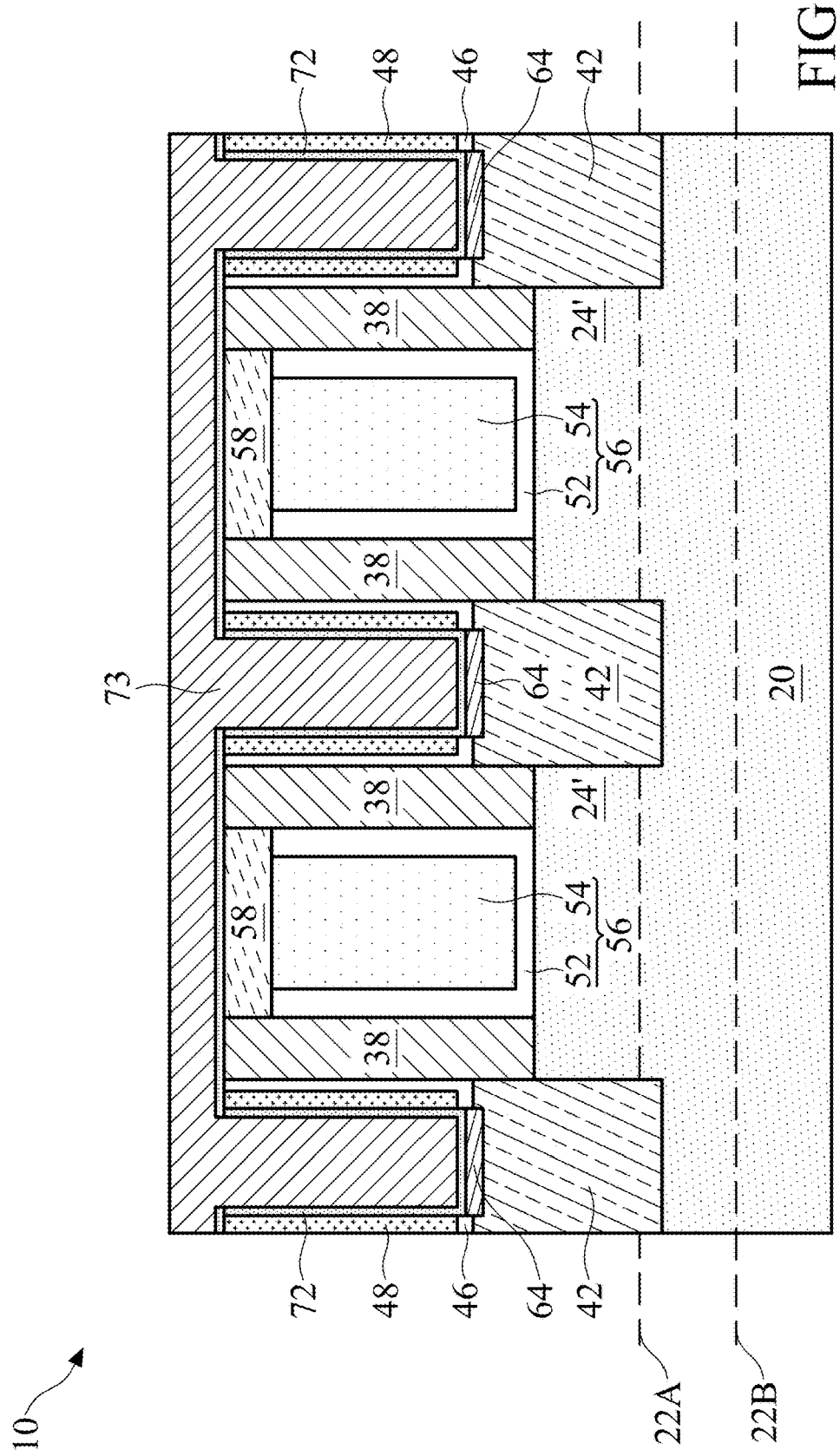
Figure 22:
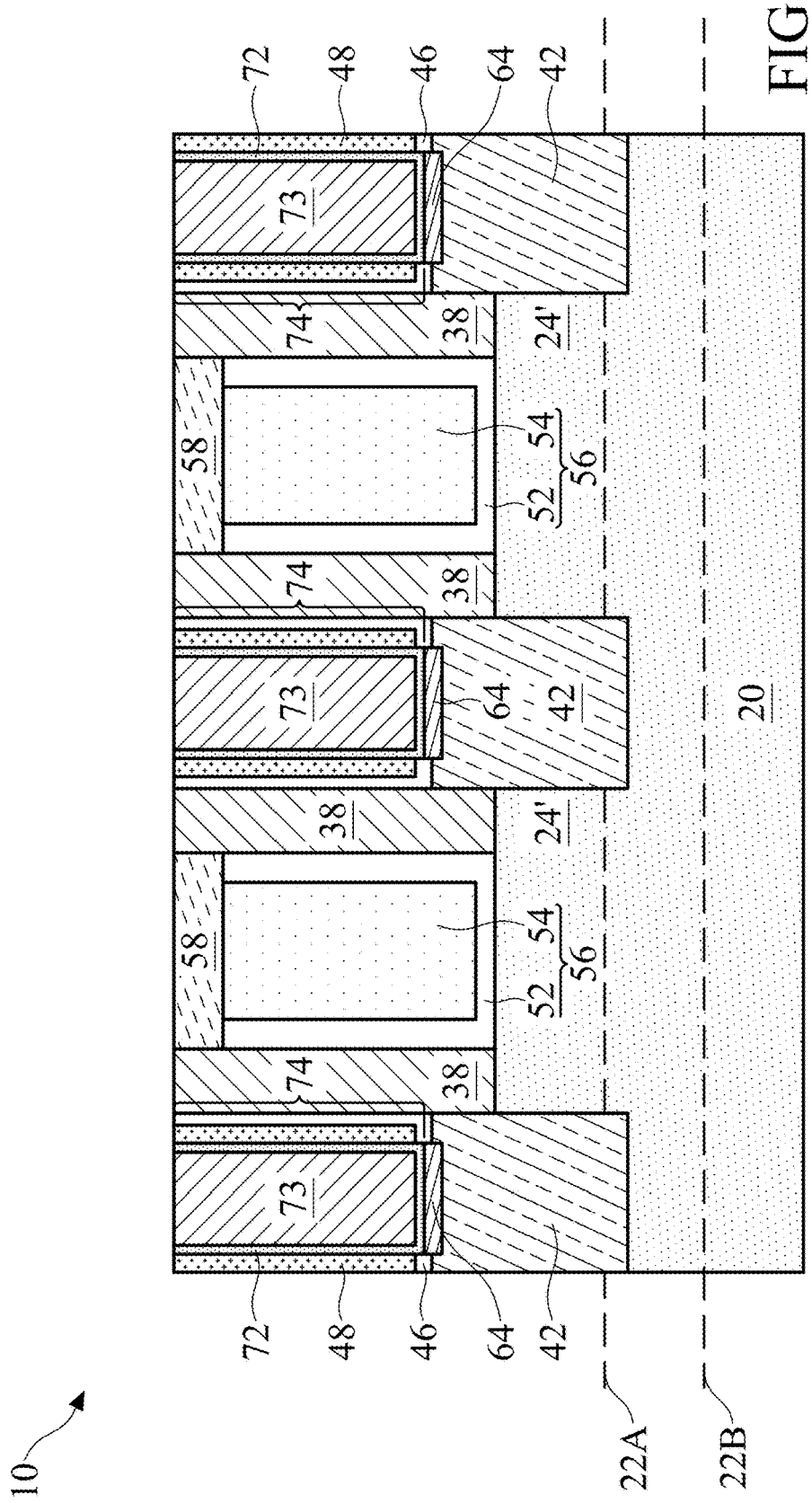

FIG. 21 illustrates the formation of metallic material 73, which includes a metallic material, which may include cobalt, tungsten, molybdenum, copper, or the like. The metal atoms in the metallic material 73 are bonded with the Si—N bonds in the SiN layer 72 to form the covalent Si—N-metal bonds. Since at least some of the silicon atoms in the Si—N-metal bonds may be parts of the ILD 48 and CESL 46, the bonding of the metallic material 73 to ILD 48 and CESL 46 is strong. No barrier layer (for example, TiN layer) is formed before metallic material 73 is deposited. FIG. 22 illustrates a planarization process to form source/drain contact plugs 74.

Figure 23:
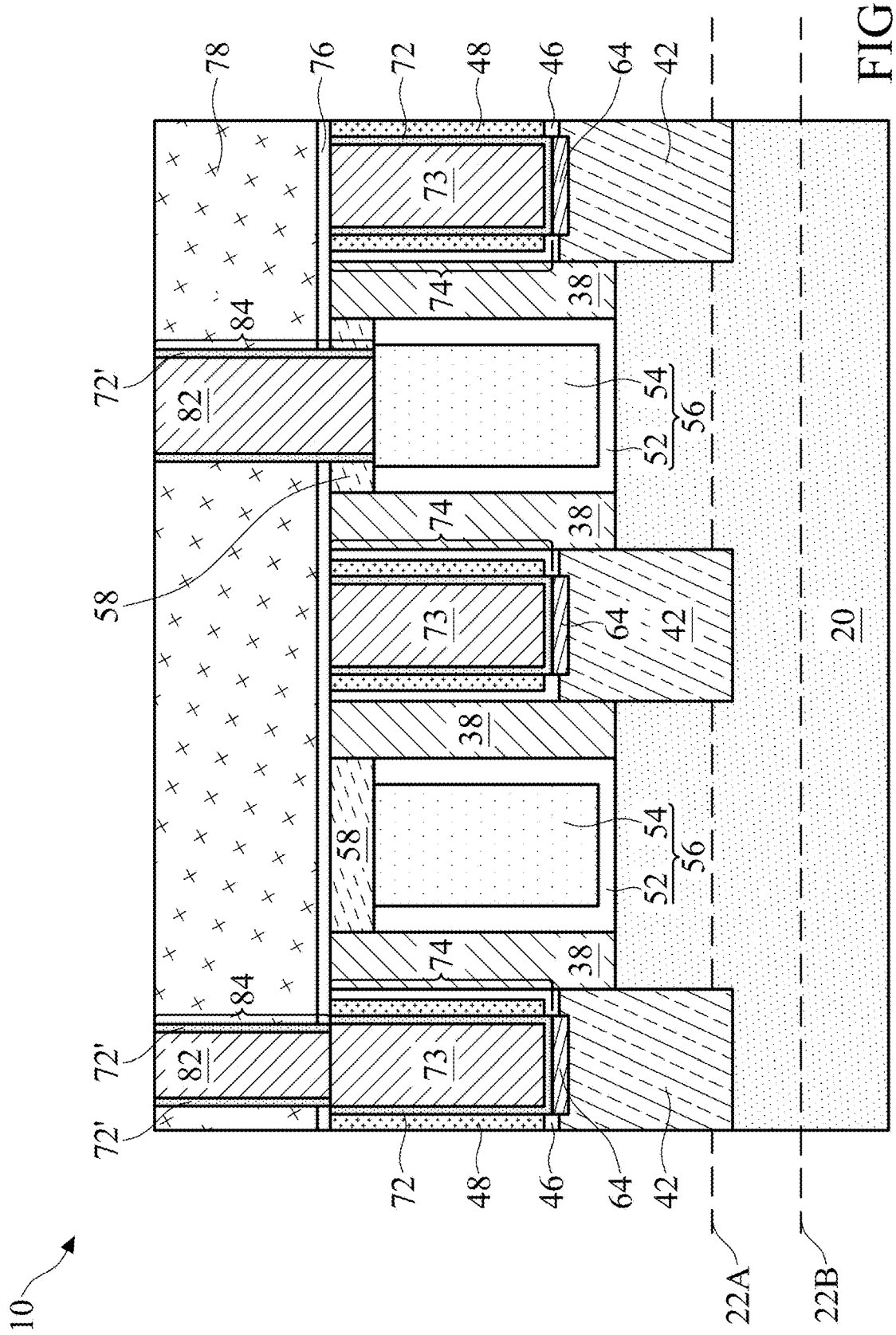

FIG. 23 illustrates the formation of etch stop layer 76, ILD 78, SiN layer 72' and contact plugs 84. The process details and the materials are discussed in preceding embodiments as in FIGS. 15 through 18, and are not repeated herein.

Experiment results have revealed that the Si—N-metal (such as Si—N-cobalt) covalent bonds have good thermal stability. In the endurance test performed at 400° C. for 30 minutes, no segregation or extrusion was observed in contact plugs formed in accordance with the embodiments. Also, no Co—N disassociation or delamination was observed. The resulting contact plugs are free from barrier layers (for example, formed of TiN). Eliminating the barrier layers results in the lateral dimension of the low-resistance parts of the contact plugs to be increased, for example, by 2 nm or greater. The overall resistance of the contact plugs is reduced.

The embodiments of the present disclosure have some advantageous features. Through the plasma treatment, and possibly the thermal soaking process, no barrier layers are needed. This results in the increase in the lateral sizes of contact plugs and the reduction of the resistance. The adhesion of the contact plugs to the ILD and CESL is good due to the superior adhesion of Si—N-metal bonds to dielectric layers and metals.

In accordance with some embodiments of the present disclosure, a method comprises etching a dielectric layer of a substrate to form an opening in the dielectric layer; forming a metal layer extending into the opening; performing an anneal process, so that a bottom portion of the metal layer reacts with a semiconductor region underlying the metal layer to form a source/drain region; performing a plasma treatment process on the substrate using a process gas comprising hydrogen gas and a nitrogen-containing gas to form a silicon-and-nitrogen-containing layer; and depositing a metallic material on the silicon-and-nitrogen-containing layer. In an embodiment, the method further includes, before the plasma treatment process, performing a thermal soaking process on the substrate using a silicon-containing process gas. In an embodiment, the thermal soaking process is performed using silane as a part of the process gas. In an embodiment, the dielectric layer comprises silicon, and wherein when the plasma treatment process is performed, a sidewall of the dielectric layer is exposed to the opening and exposed to the hydrogen gas and the nitrogen-containing gas. In an embodiment, the plasma treatment process and at least a part of the depositing the metallic material are in-situ performed without vacuum break therebetween. In an embodiment, the depositing the metallic material comprises depositing a metal seed layer, and the depositing the metal seed layer and the plasma treatment process are in-situ performed without vacuum break in between. In an embodiment, the nitrogen-containing gas comprises nitrogen ($N_2$) gas. In an embodiment, the plasma treatment process results in a mono layer of Si—N bonds to be formed.

In accordance with some embodiments of the present disclosure, a method comprises performing a thermal soaking process using a silicon-containing gas to deposit a silicon layer on a surface of an underlying layer; performing a plasma treatment process on the silicon layer to form a silicon-and-nitrogen-containing layer; and depositing a metallic layer on the silicon-and-nitrogen-containing layer to form Si—N-metal bonds, wherein the plasma treatment process and the depositing the metallic layer are in-situ performed in a same process chamber without vacuum break therebetween. In an embodiment, the silicon layer is deposited as a mono layer. In an embodiment, the Si—N-metal bonds are formed as a mono layer. In an embodiment, the thermal soaking process is performed using silane as a part of the silicon-containing gas. In an embodiment, the plasma treatment process is performed using hydrogen ($H_2$) and nitrogen ($N_2$) as process gases. In an embodiment, there is no vacuum break occurring between the thermal soaking process and the depositing the metallic layer. In an embodiment, the depositing the metallic layer comprises depositing a cobalt layer.

In accordance with some embodiments of the present disclosure, an integrated circuit structure comprises a dielectric layer; a metal ring contacting sidewalls of the dielectric layer; a metal region encircled by the metal ring; and a silicon-and-nitrogen rich layer between the metal ring and the metal region, wherein a silicon atomic percentage in the silicon-and-nitrogen rich layer is higher than silicon atomic percentages in both of the metal ring and the metal region, and a first nitrogen atomic percentage in the silicon-and-nitrogen rich layer is higher than second nitrogen atomic percentages in the metal ring and the metal region. In an embodiment, the integrated circuit structure includes a semiconductor region underlying the dielectric layer; a metal silicide region on top of the semiconductor region, wherein the metal silicide region is overlapped by the metal region; and a nitrogen-rich layer overlapping and contacting the metal silicide region, wherein a third nitrogen atomic percentage in the nitrogen-rich layer is higher than a fourth nitrogen atomic percentage in the metal silicide region and the second nitrogen atomic percentage in the metal region. In an embodiment, the metal ring and the metal region are formed of different metals. In an embodiment, the metal ring comprises titanium, and the metal region comprises cobalt. In an embodiment, the dielectric layer comprises a silicon-base dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a dielectric layer of a substrate to form an opening in the dielectric layer;
   forming a metal layer extending into the opening;
   performing an anneal process, so that a bottom portion of the metal layer reacts with a semiconductor region underlying the metal layer to form a source/drain silicide region;
   performing a plasma treatment process on the substrate using a process gas comprising hydrogen gas and a nitrogen-containing gas to form a silicon-and-nitrogen-containing layer; and
   depositing a metallic material on the silicon-and-nitrogen-containing layer.

2. The method of claim 1 further comprising:
   before the plasma treatment process, performing a thermal soaking process on the substrate using a silicon-containing process gas.

3. The method of claim 1, wherein at a time the plasma treatment process is finished, the silicon-and-nitrogen-containing layer is free from metal therein.

4. The method of claim 1, wherein the dielectric layer comprises silicon, and wherein when the plasma treatment process is performed, a sidewall of the dielectric layer is exposed to the opening and exposed to the hydrogen gas and the nitrogen-containing gas.

5. The method of claim 1, wherein the plasma treatment process and at least a part of the depositing the metallic material are in-situ performed without vacuum break therebetween.

6. The method of claim 5, wherein the depositing the metallic material comprises depositing a metal seed layer, and the depositing the metal seed layer and the plasma treatment process are in-situ performed without vacuum break in between.

7. The method of claim 1, wherein the plasma treatment process is performed after the source/drain silicide region is formed, and wherein the silicon-and-nitrogen-containing layer extends on both of the source/drain silicide region and the dielectric layer.

8. The method of claim 1, wherein the plasma treatment process results in a mono layer of Si—N bonds to be formed.

9. A method comprising:
   performing a thermal soaking process using a silicon-containing gas to deposit a silicon layer on a surface of an underlying layer;
   performing a plasma treatment process on the silicon layer to form a silicon-and-nitrogen-containing layer; and
   depositing a metallic layer on the silicon-and-nitrogen-containing layer, wherein the plasma treatment process and the depositing the metallic layer are in-situ performed in a same process chamber without vacuum break therebetween.

10. The method of claim 9, wherein the silicon layer is deposited as a mono layer.

11. The method of claim 9, wherein the metallic layer and the silicon-and-nitrogen-containing layer form a SiN layer, and the SiN layer forms a bond with metal atoms in the metallic layer.

12. The method of claim 9, wherein the underlying layer comprises an inter-layer dielectric and a source/drain silicide region, and the silicon layer is formed on both of the inter-layer dielectric and the source/drain silicide region.

13. The method of claim 9, wherein the plasma treatment process is performed using hydrogen ($H_2$) and nitrogen ($N_2$) as process gases.

14. The method of claim 9, wherein there is no vacuum break occurring between the thermal soaking process and the depositing the metallic layer.

15. The method of claim 9, wherein the depositing the metallic layer comprises a plating process.

16. A method comprising:
   forming a silicide region;
   depositing a silicon layer over the silicide region;
   performing a treatment process on the silicon layer using hydrogen ($H_2$) and a nitrogen-containing gas to generate a silicon-and-nitrogen containing layer, wherein at a time the treatment process is finished, the silicon-and-nitrogen containing layer is free from metal therein; and
   depositing a cobalt layer over and contacting the silicon-and-nitrogen containing layer.

17. The method of claim 16, wherein the depositing the silicon layer comprises thermally soaking the silicide region in a silicon-containing process gas.

18. The method of claim 17, wherein the depositing the silicon layer comprises thermally soaking the silicide region in silane.

19. The method of claim 16, wherein the treatment process comprises a plasma treatment process.

20. The method of claim 16, wherein the cobalt layer forms bonds with the silicon-and-nitrogen containing layer that is free from metal therein.

* * * * *